(12) United States Patent
Darwish et al.

(10) Patent No.: US 10,720,510 B2
(45) Date of Patent: Jul. 21, 2020

(54) LATERAL TRANSISTORS AND METHODS WITH LOW-VOLTAGE-DROP SHUNT TO BODY DIODE

(71) Applicant: MaxPower Semiconductor Inc., San Jose, CA (US)

(72) Inventors: Mohamed N. Darwish, Campbell, CA (US); Jun Zeng, Torrance, CA (US); Richard A. Blanchard, Los Altos, CA (US)

(73) Assignee: MaxPower Semiconductor Inc., San Jose, CA (US)

( * ) Notice: Subject to any disclaimer, the term of this patent is extended or adjusted under 35 U.S.C. 154(b) by 258 days.

(21) Appl. No.: 15/975,284

(22) Filed: May 9, 2018

(65) Prior Publication Data
US 2018/0323285 A1 Nov. 8, 2018

Related U.S. Application Data

(60) Division of application No. 14/694,929, filed on Apr. 23, 2015, now Pat. No. 9,997,614, which is a (Continued)

(51) Int. Cl.
*H01L 29/66* (2006.01)
*H01L 27/088* (2006.01)
(Continued)

(52) U.S. Cl.
CPC .. *H01L 29/66734* (2013.01); *H01L 21/26506* (2013.01); *H01L 21/823412* (2013.01); *H01L 21/823437* (2013.01); *H01L 21/823475* (2013.01); *H01L 21/823487* (2013.01); *H01L 27/088* (2013.01); *H01L 29/0878* (2013.01); *H01L 29/1033* (2013.01); *H01L 29/1095* (2013.01); *H01L 29/36* (2013.01); *H01L 29/407* (2013.01); *H01L 29/41741* (2013.01); *H01L 29/41766* (2013.01); *H01L 29/4236* (2013.01); *H01L 29/66727* (2013.01); (Continued)

(58) Field of Classification Search
CPC .......... H01L 29/41741; H01L 29/4236; H01L 29/66712; H01L 29/66734; H01L 29/685; H01L 29/7802; H01L 29/7813
See application file for complete search history.

(56) References Cited

U.S. PATENT DOCUMENTS 8,319,278 B1 * 11/2012 Zeng ................... H01L 29/7809
257/330
2008/0166845 A1 * 7/2008 Darwish ............. H01L 29/0649
438/270

(Continued)

*Primary Examiner* — Marcos D. Pizarro
(74) *Attorney, Agent, or Firm* — Groover & Associates PLLC; Gwendolyn G. Corcoran; Robert O. Groover, III

(57) ABSTRACT

Methods and systems for power semiconductor devices integrating multiple quasi-vertical transistors on a single chip. Multiple power transistors (or active regions) are paralleled, but one transistor has a lower threshold voltage. This reduces the voltage drop when the transistor is forward-biased. In an alternative embodiment, the power device with lower threshold voltage is simply connected as a depletion diode, to thereby shunt the body diodes of the active transistors, without affecting turn-on and ON-state behavior.

10 Claims, 29 Drawing Sheets

Related U.S. Application Data continuation of application No. 13/758,703, filed on Feb. 4, 2013, now Pat. No. 9,048,118.

(60) Provisional application No. 61/597,979, filed on Feb. 13, 2012.

(51) Int. Cl.

| | | |
|---|---|---|
| *H01L 29/417* | (2006.01) | |
| *H01L 29/40* | (2006.01) | |
| *H01L 29/78* | (2006.01) | |
| *H01L 29/08* | (2006.01) | |
| *H01L 29/10* | (2006.01) | |
| *H01L 21/265* | (2006.01) | |
| *H01L 21/8234* | (2006.01) | |
| *H01L 29/36* | (2006.01) | |
| *H01L 29/423* | (2006.01) | |
| *H01L 29/739* | (2006.01) | |

(52) U.S. Cl.
CPC ...... *H01L 29/7395* (2013.01); *H01L 29/7803* (2013.01); *H01L 29/7813* (2013.01); *H01L 29/7827* (2013.01); *H01L 29/7831* (2013.01); *H01L 29/7835* (2013.01); *H01L 29/0847* (2013.01); *H01L 29/42368* (2013.01); *H01L 29/66666* (2013.01)

(56) References Cited

U.S. PATENT DOCUMENTS

| | | | |
|---|---|---|---|
| 2010/0219468 A1* | 9/2010 | Zeng | H01L 29/0634 257/330 |
| 2011/0006361 A1* | 1/2011 | Darwish | H01L 21/82341 257/329 |
| 2011/0079843 A1* | 4/2011 | Darwish | H01L 29/8611 257/331 |
| 2011/0169103 A1* | 7/2011 | Darwish | H01L 29/7823 257/409 |

* cited by examiner

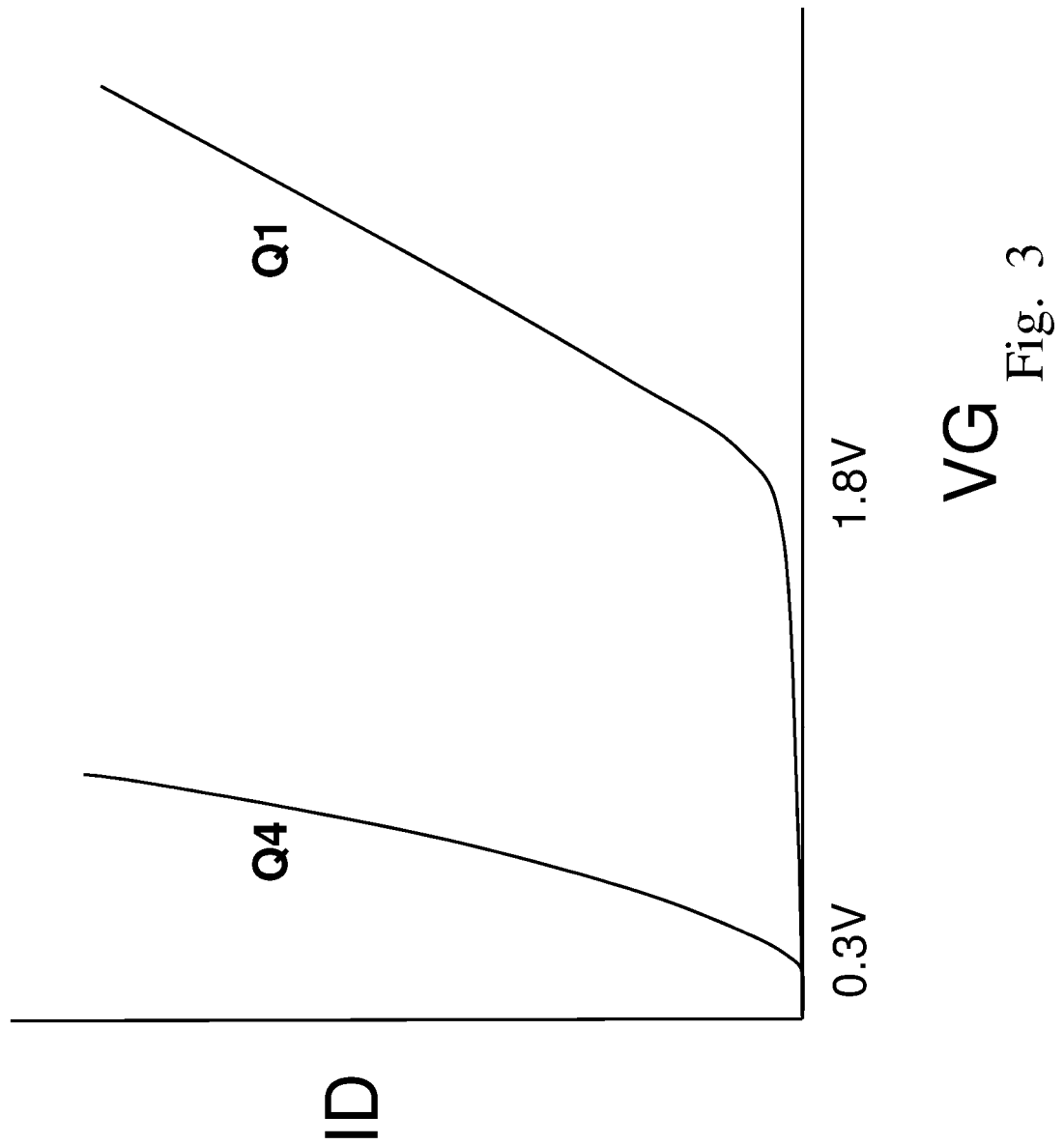

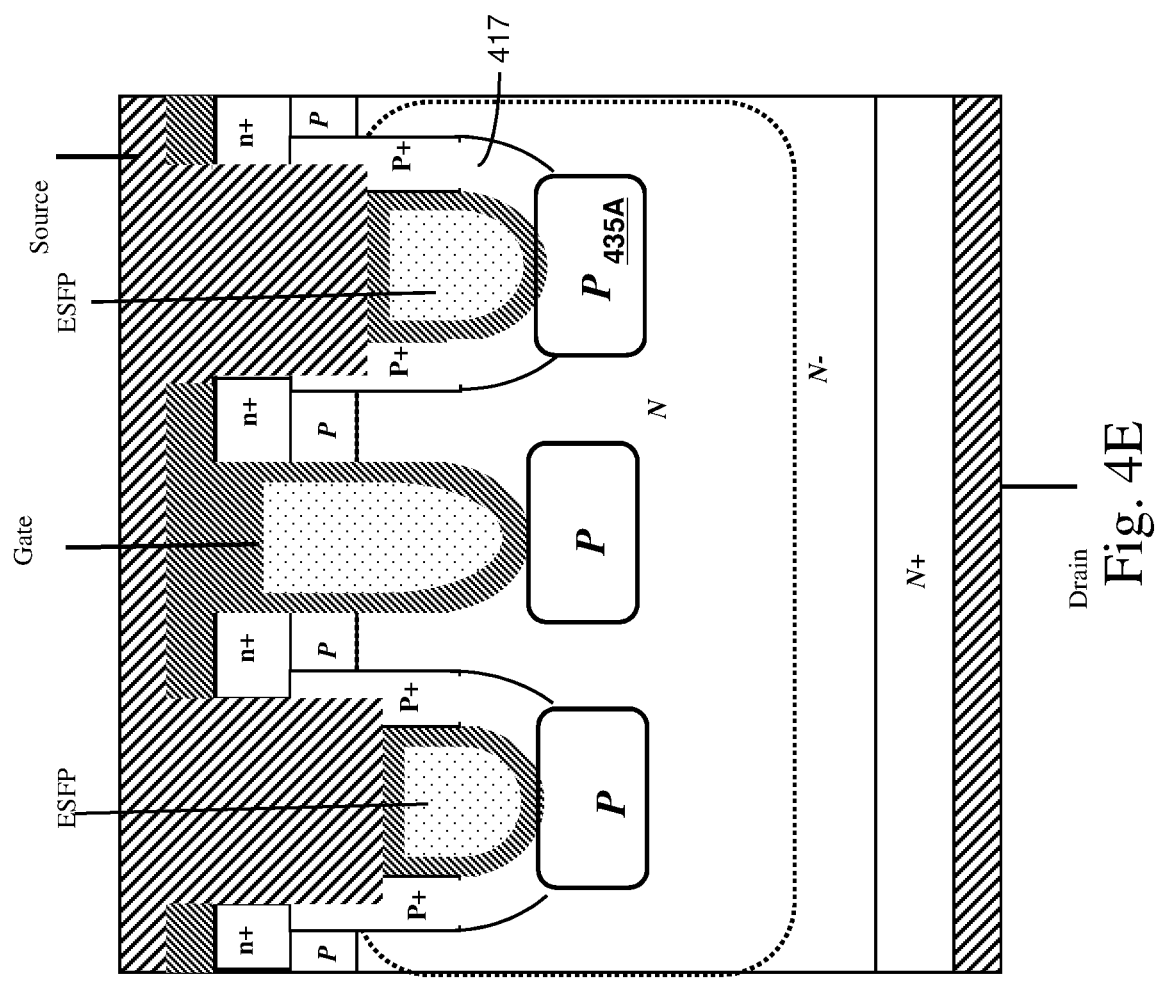

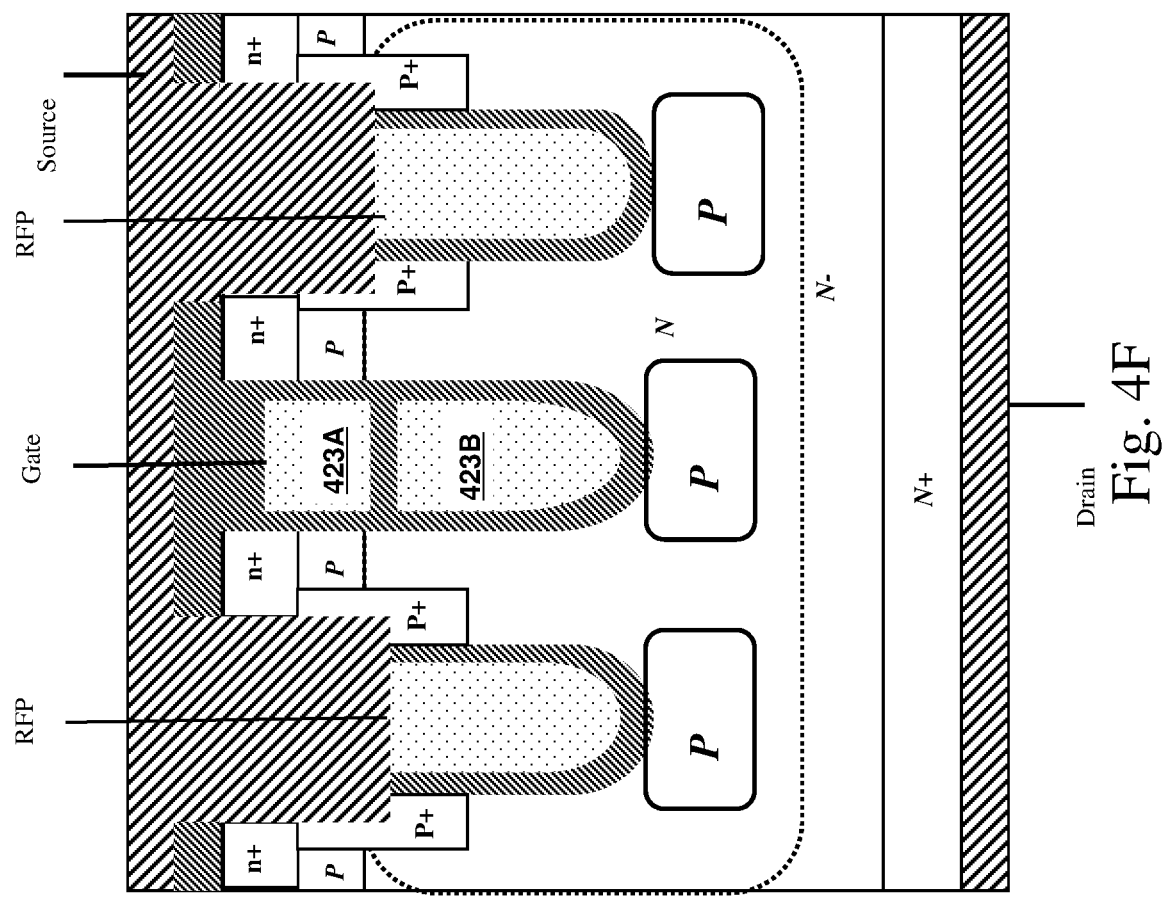

LATERAL TRANSISTORS AND METHODS WITH LOW-VOLTAGE-DROP SHUNT TO BODY DIODE

CROSS-REFERENCE

Priority is claimed from 61/597,979, which is hereby incorporated by reference.

BACKGROUND

The present application relates to power MOS structures with inherent low forward voltage drop and fast switching diode characteristics, and more particularly to monolithically integrated gated power MOSFETs, in which a power MOS transistor is shunted with a similar power MOS transistor which has a lower threshold voltage.

Note that the points discussed below may reflect the hindsight gained from the disclosed inventions, and are not necessarily admitted to be prior art.

Note that the points discussed below may reflect the hindsight gained from the disclosed inventions, and are not necessarily admitted to be prior art.

In MOSFET switches, and particularly at high switching speeds, reverse charge recovery $Q_{rr}$ contributes significantly to switching power losses. For example, in n-channel DC-DC converters, the transistor can at times operate in the third quadrant, i.e when its body diode is forward biased, which results in stored minority charge. This stored minority charge, in turn, causes some time delay in turning off the transistor.

Schottky barrier diodes (SBD) are often used as freewheeling diodes in many converter topologies to address this problem. The Schottky barrier diode may be electrically connected in parallel with the body junction, since the Schottky barrier diode provides a lower forward voltage drop, and avoids minority carrier injection. The Schottky barrier diode will thus also typically have a lower stored charge in reverse recovery, which reduces switching losses.

Monolithically integrated MOSFET-SBD structures such as Trench MOSFET Barrier Structures (TMBS) have been proposed to lower $Q_{rr}$ in power MOSFETs. FIG. 7A shows a generic implementation of a monolithically integrated MOSFET and SBD structure. FIG. 7B shows one example of a monolithically integrated structure that includes one or more MOSFET sections adjacent to one or more SBD sections using Recessed Field Plate (RFP) trenches.

Trench MOSFET barrier structures such as shown in FIG. 7A suffer from relatively higher leakage current at reverse bias, and are also subject to additional process complexities to include a Schottky barrier in the MOS process flow.

New power MOSFET structures (for example in U.S. Pat. Nos. 7,843,004 and 8,076,719 and applications US 2010-0219462 A1 and US 2011-0254088 A1, which are hereby incorporated by reference) include Recessed Field Plate (RFP), Embedded Field Plate (EFP), Embedded Shielded Field Plate (ESFP) and quasi-vertical planar gate structures. Such MOSFET structures provide low specific on-resistance, gate-drain charge $Q_{gd}$ and lower gate charge $Q_g$. However, to further reduce switching power losses, a reduction in reverse recovery charge $Q_{rr}$ is also needed.

SUMMARY

The present application relates to power MOS structures with inherent low forward voltage drop and fast switching diode characteristics, and more particularly to monolithically integrated gated power MOSFETs, in which a power MOS transistor is shunted with a similar power MOS transistor which has a lower threshold voltage.

The present inventors have realized that the reverse recovery charge problem can be alleviated by including a transistor with a lower threshold voltage in addition to the primary array of switching transistors.

The disclosed innovations, in various embodiments, provide one or more of at least the following advantages. However, not all of these advantages result from every one of the innovations disclosed, and this list of advantages does not limit the various claimed inventions.

Reduced switching power loss
Low leakage current
Low forward voltage drop
Low reverse recovery charge $Q_{rr}$
Better temperature behavior than Schottky barrier diode

BRIEF DESCRIPTION OF THE DRAWINGS

The disclosed inventions will be described with reference to the accompanying drawings, which show important sample embodiments and which are incorporated in the specification hereof by reference, wherein:

FIG. 3 shows a schematic diagram of threshold voltage behaviors.

FIGS. 4A-4H show several sample embodiments of the present inventions.

DETAILED DESCRIPTION OF SAMPLE EMBODIMENTS

Figure 1:
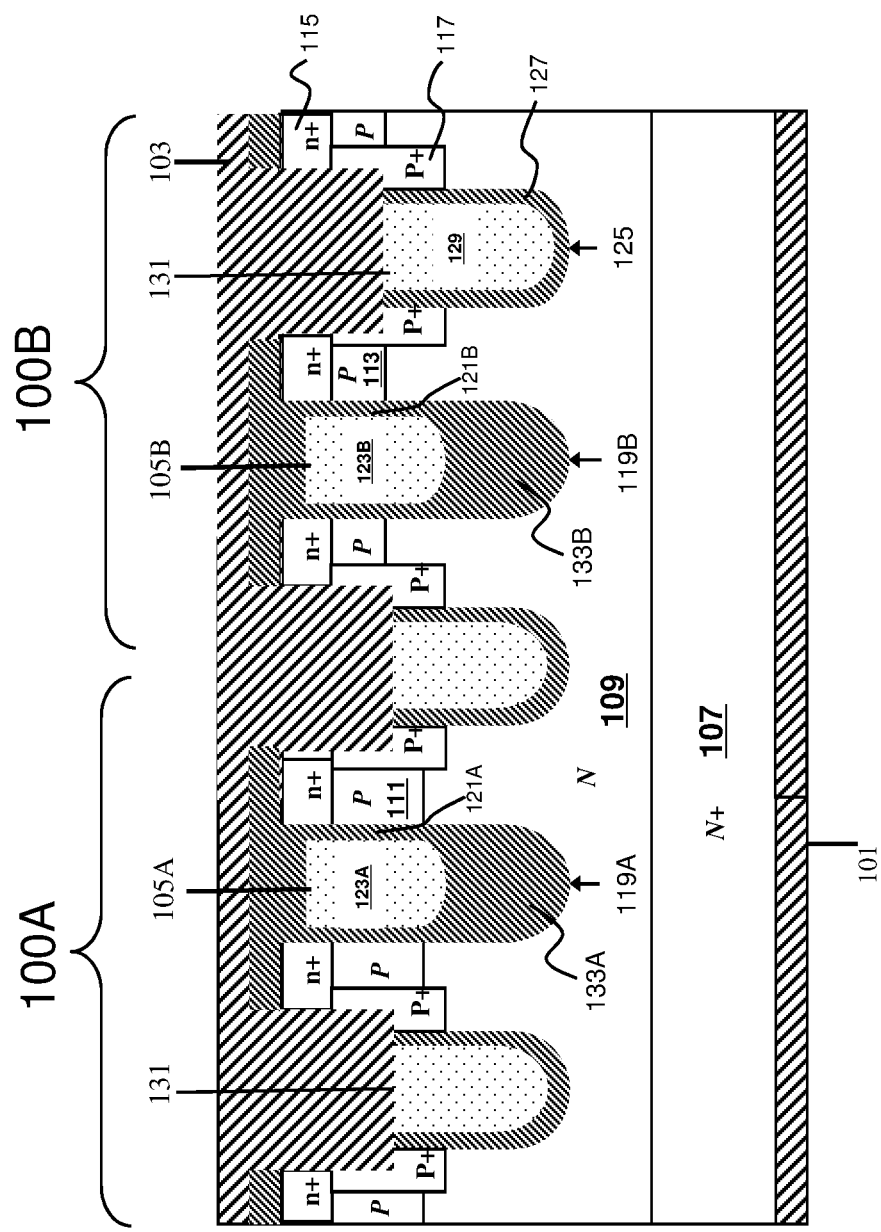
FIG. 1 shows one sample embodiment of the present inventions.

The numerous innovative teachings of the present application will be described with particular reference to presently preferred embodiments (by way of example, and not of limitation). The present application describes several inventions, and none of the statements below should be taken as limiting the claims generally.

The present application relates to power MOS structures with inherent low forward voltage drop and fast switching diode characteristics, and more particularly to monolithically integrated gated power MOSFETs, in which a power MOS transistor is shunted with a similar power MOS transistor which has a lower threshold voltage.

The present inventors have realized that the reverse recovery charge problem can be alleviated by including a transistor with a shorter channel or lower threshold voltage in addition to the primary array of switching transistors. It is preferable that the gate electrode of the lower threshold voltage ($V_{th}$) transistor segment is shorted to the source electrode. In this case the lower $V_{th}$ segment is effectively a diode with lower forward drop and a fast switching speed or low stored reverse recovery charge $Q_{rr}$ due to low minority carrier injection.

This can be easily achieved in trench transistors, e.g. by using an additional body implant to make the vertical channel length of the primary switching transistors longer than that of the low-threshold-voltage transistor. The shorter channel results in a lower threshold voltage. When the body diode is forward biased, the transistor conducts majority carriers from the drain to the source electrodes due to the lower energy barrier. This results in a lower forward voltage drop at the same current level. It is therefore generally preferable that the gate electrode of the lower-threshold-voltage transistor segment be shorted to the source electrode. In this case, the lower-threshold-voltage segment is effectively a diode with lower forward voltage drop and faster switching speed or low stored reverse recovery charge $Q_{rr}$ due to low minority carrier injection.

In one sample embodiment, two gated power MOSFET structures can be integrated on a single semiconductor die, where one of the transistors has a lower threshold voltage ($V_{th}$) than does the other transistor. These power MOSFETs can be e.g. vertical or quasi-vertical structures, though both are preferably of the same type.

In vertical trench-gated MOSFET structures, differing channel lengths can be attained, e.g., by performing a first implant to form the short-channel body regions, and then performing a second masked implant, which is deeper than the first implant, to form the long-channel body regions in the desired regions. Alternatively, increasing the depth of the n+ source while maintaining the same p-body junction depth results in a shorter channel.

In quasi-vertical planar-gated MOSFET structures, shorter channel lengths can be obtained, for example, by changing the length of the gate. This can be combined with, e.g., threshold-voltage adjust implants to reduce $V_{th}$ in appropriate channel regions.

FIG. 1 shows one sample embodiment in which high-threshold-voltage MOSFET section 100A and low-threshold-voltage MOSFET section 100B are integrated on a single semiconductor die. In one sample embodiment, the starting material is, e.g., N epi layer 109 on N+ substrate 107. In this sample embodiment, source terminal 103 and drain terminal 101 are common to MOSFETs 100A and 100B. Gates 105A and 105B can be commonly connected, as in e.g. FIG. 2A, or independently connected, as in e.g. FIG. 2B.

In this embodiment, MOSFETs 100A and 100B are formed identically except as noted.

In one sample embodiment, N+ source regions 115 are formed identically in sections 100A and 100B.

In one sample embodiment, the vertical extent of P body regions 111 in MOSFET 100A is greater than the vertical extent of P body regions 113 in MOSFET 100B. The shorter channel length in MOSFET 100B resulting from shallower P body 113 is a primary factor in the lower $V_{th}$ of MOSFET section 100B.

In one sample embodiment, P+ body contact regions 117 are formed identically in MOSFET sections 100A and 100B.

In one sample embodiment, recessed field plate (RFP) trenches 125 and gate trenches 119A and 119B are all formed in the same process step in MOSFETs 100A and 100B. Gate oxide layers 121A and 121B are, in the sample embodiment of FIG. 1, formed in gate trenches 119A and 119B with similar thick bottom oxide portions 133A and 133B. Polysilicon is deposited in trenches 119A and 119B to form identical gate electrodes 123A and 123B.

Recessed field plates (RFPs) 131 are, in the most preferred embodiment, all identical. RFP oxide layers 127 line trenches 125, surrounding RFP electrodes 129.

In the most preferred embodiment, drain metallization 101 contacts N+ drain region 107 identically for MOSFET sections 100A and 100B, permitting a single common connection to drain terminal 101.

In the most preferred embodiment, source metallization 103 is common to MOSFETs 100A and 100B, permitting a single common connection to source terminal 103.

Figure 2A:
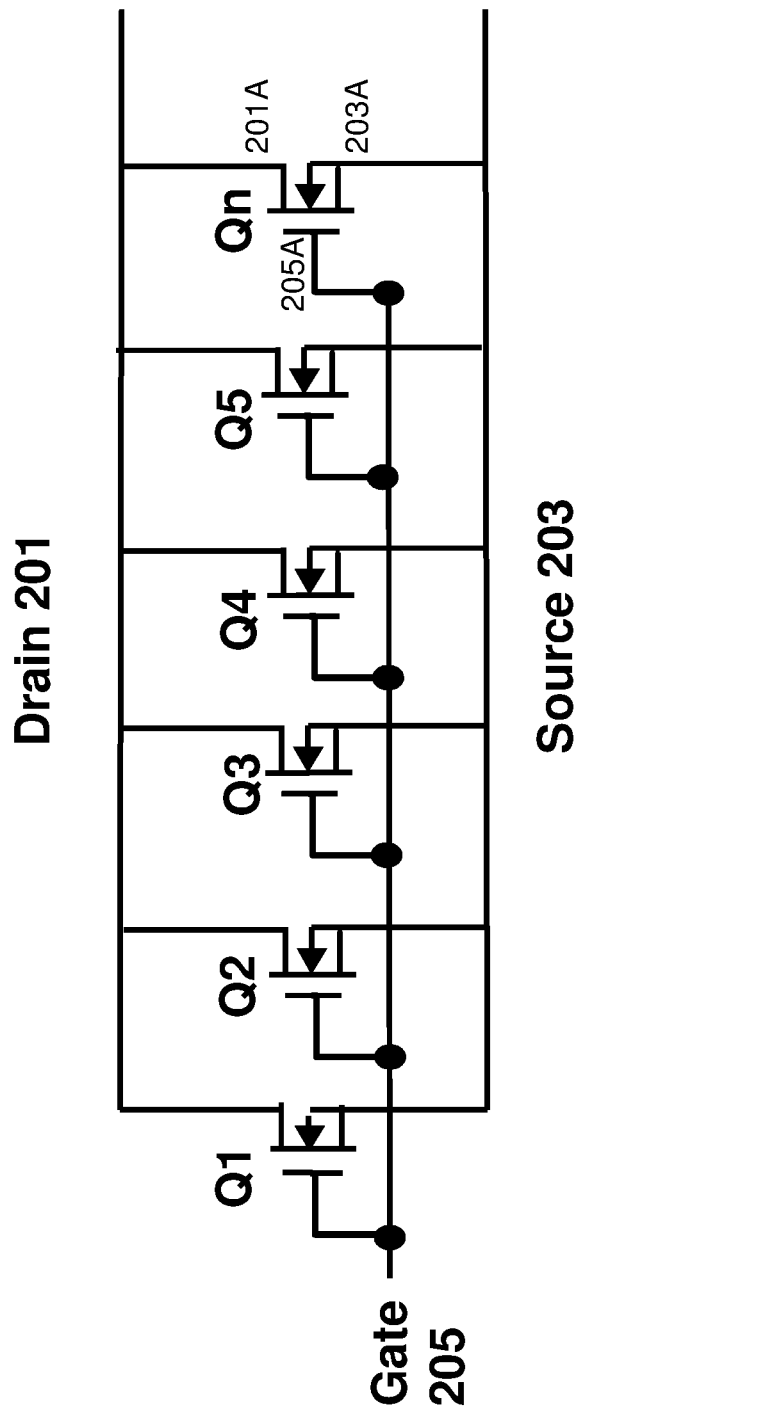
FIGS. 2A-2B show circuit representations of two connection configurations for some embodiments of the present inventions.
Figure 2B:
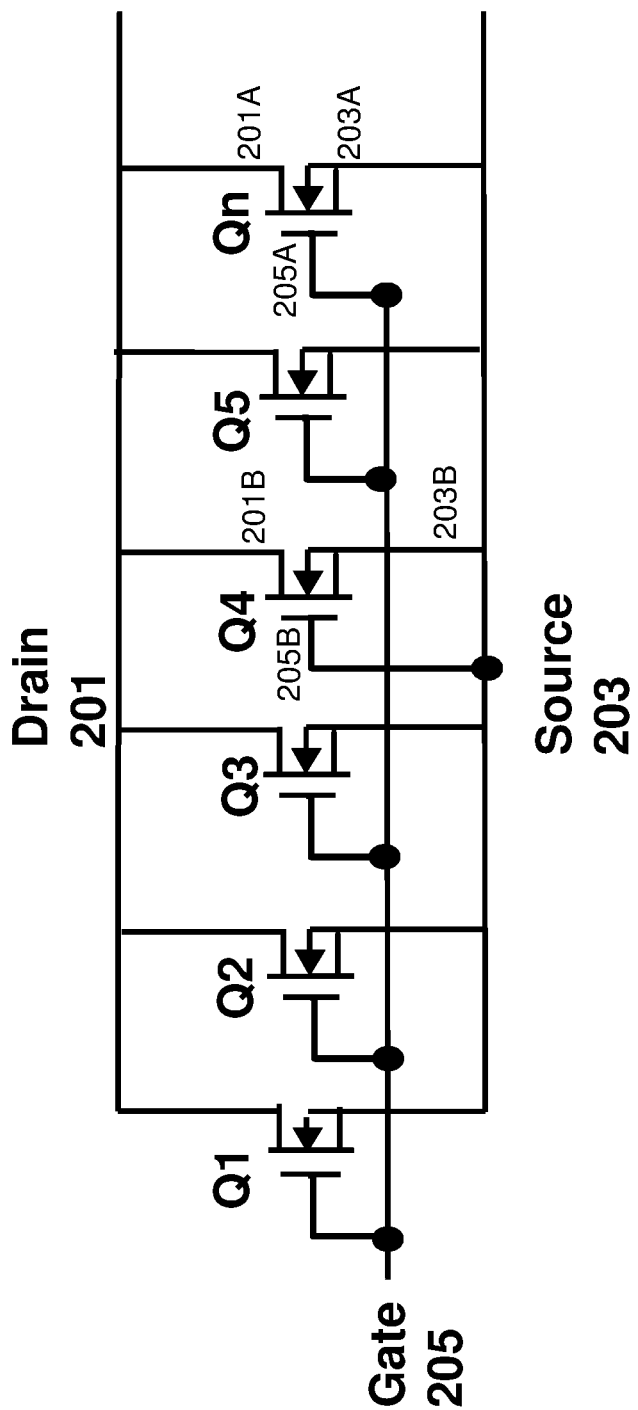

FIGS. 2A and 2B show circuit representations of two sample embodiments of mixed-threshold-voltage power MOSFETs, each consisting of an array of MOSFET cells connected in parallel. MOSFET transistor elements Q1-Qn are connected in parallel to drain terminal 201, source terminal 203, and gate terminal 205. In each case, transistor Q4 has a lower threshold voltage $V_{th}$ than do transistors Q1-Q3 and Q5-Qn.

In FIG. 2A, the source electrode 203A, drain electrode 201A, and gate electrode 205A of each transistor Q1-Qn are connected appropriately to source terminal 203, drain terminal 201, and gate terminal 205, respectively. The lower $V_{th}$ of transistor Q4 provides a path for majority current conduction when the body diode is forward biased. This limits the forward drop and $Q_{rr}$ of the body diode, reducing switching losses.

In FIG. 2B, the source electrode 203A, drain electrode 201A, and gate electrode 205A of each of transistors Q1-Q3 and Q5-Qn are still connected appropriately to source terminal 203, drain terminal 201, and gate terminal 205. For transistor Q4, source electrode 203B is connected to source terminal 203 and drain electrode 201B is connected to drain terminal 201, but gate electrode 205B is connected to source terminal 203. This prevents transistor Q4 from turning on prematurely when the p-body drain junction is reverse biased and the gate is positively biased.

FIG. 3 shows a simplified example schematic diagram of the threshold voltage behaviors of low-threshold-voltage transistor Q4 and high-threshold-voltage transistor Q1.

FIGS. 4A-4H show several alternative embodiments that can be used e.g. to replace shorter-channel, lower-threshold-voltage MOSFET section 100B in the embodiment of FIG. 1.

Figure 4A:
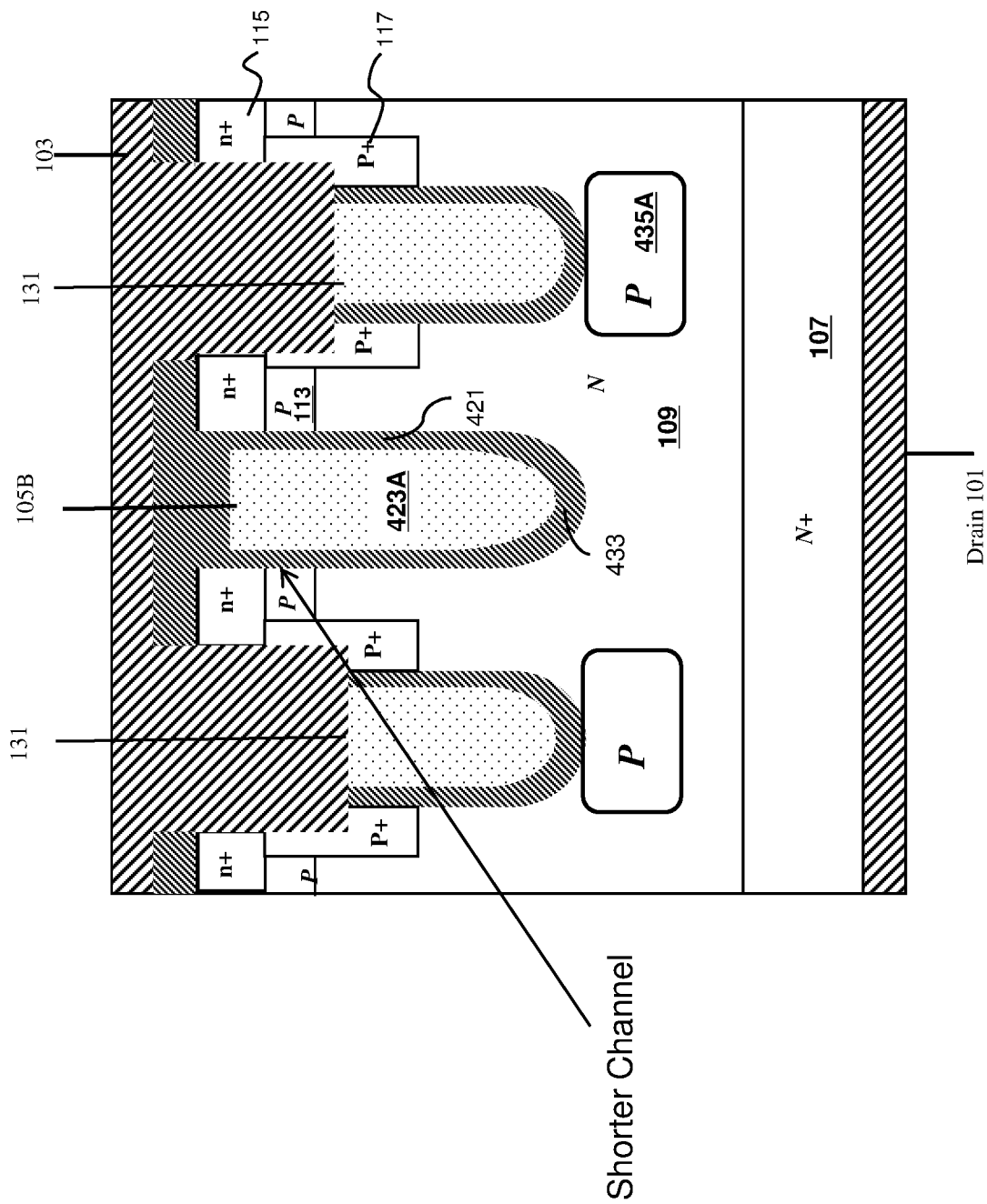

In the sample embodiment of FIG. 4A, bottom oxide 433 is roughly the same thickness as gate oxide 421. Gate electrode 423A extends to fill the space occupied by e.g. thick bottom oxide 133B in the sample embodiment of FIG. 1. P-shield regions 435A are present beneath recessed field plates 131. In the sample embodiment of FIG. 4B, P-shield regions 435B are also present beneath the gate. The P-shield regions are preferably connected to the p-body region at certain areas of the device (not shown)

Figure 4B:
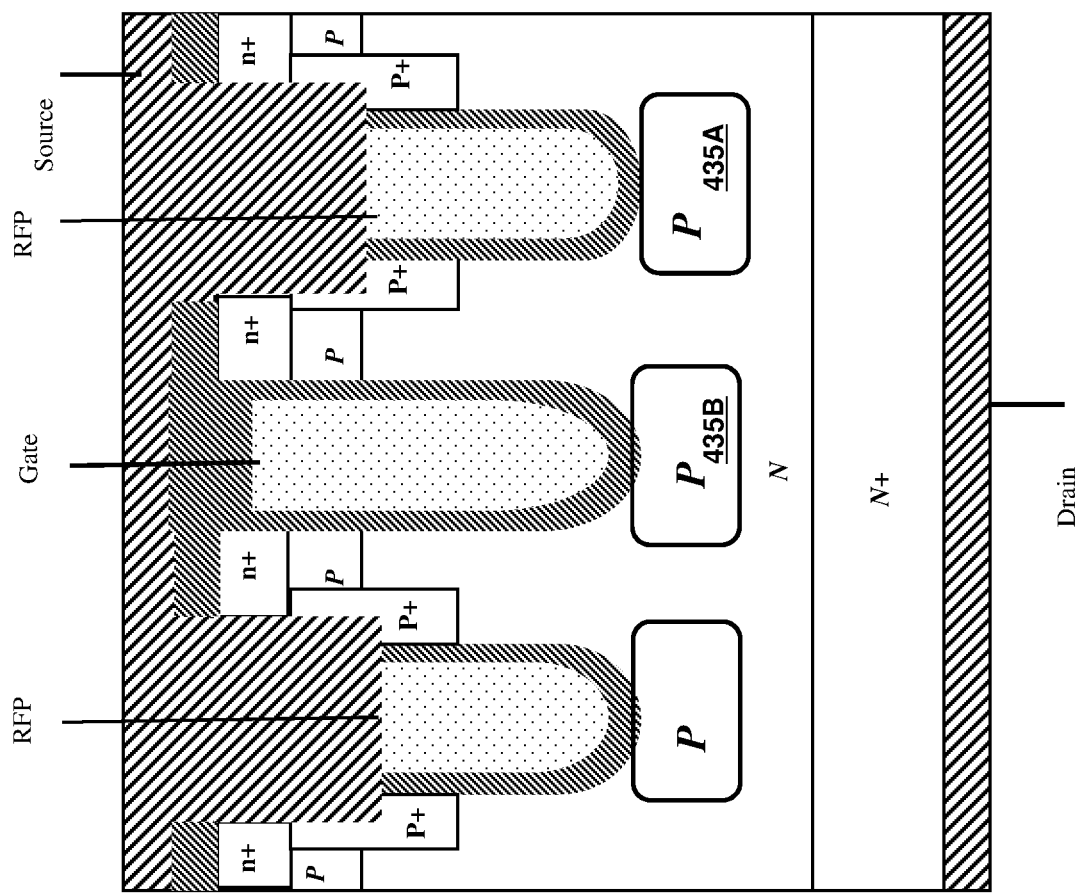
Figure 4C:
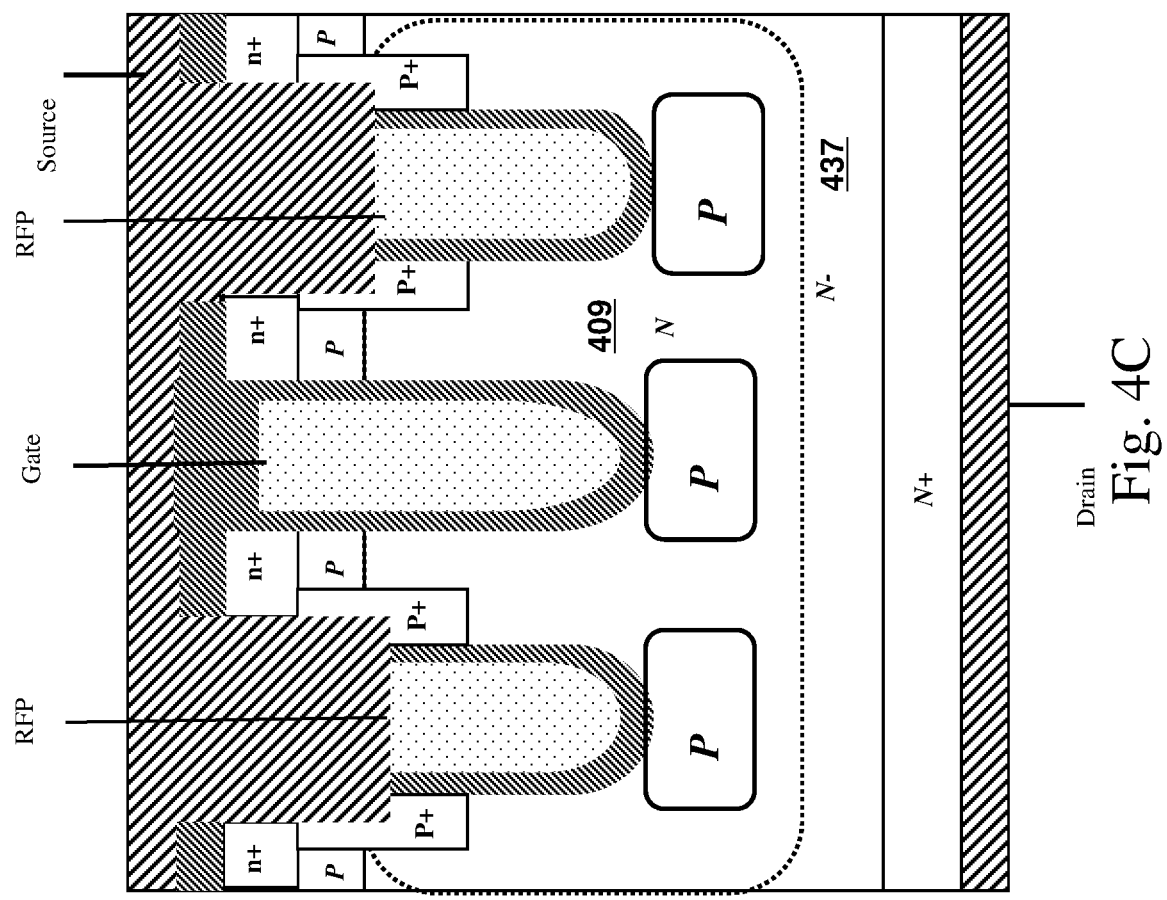

FIG. 4C shows another sample embodiment similar to that of FIG. 4B, in which n-enhancement region 409 is located in N− epi layer 437 to lower on-resistance and adjust the pinch-off voltage at the neck of the gate and RFP trenches.

Figure 4D:
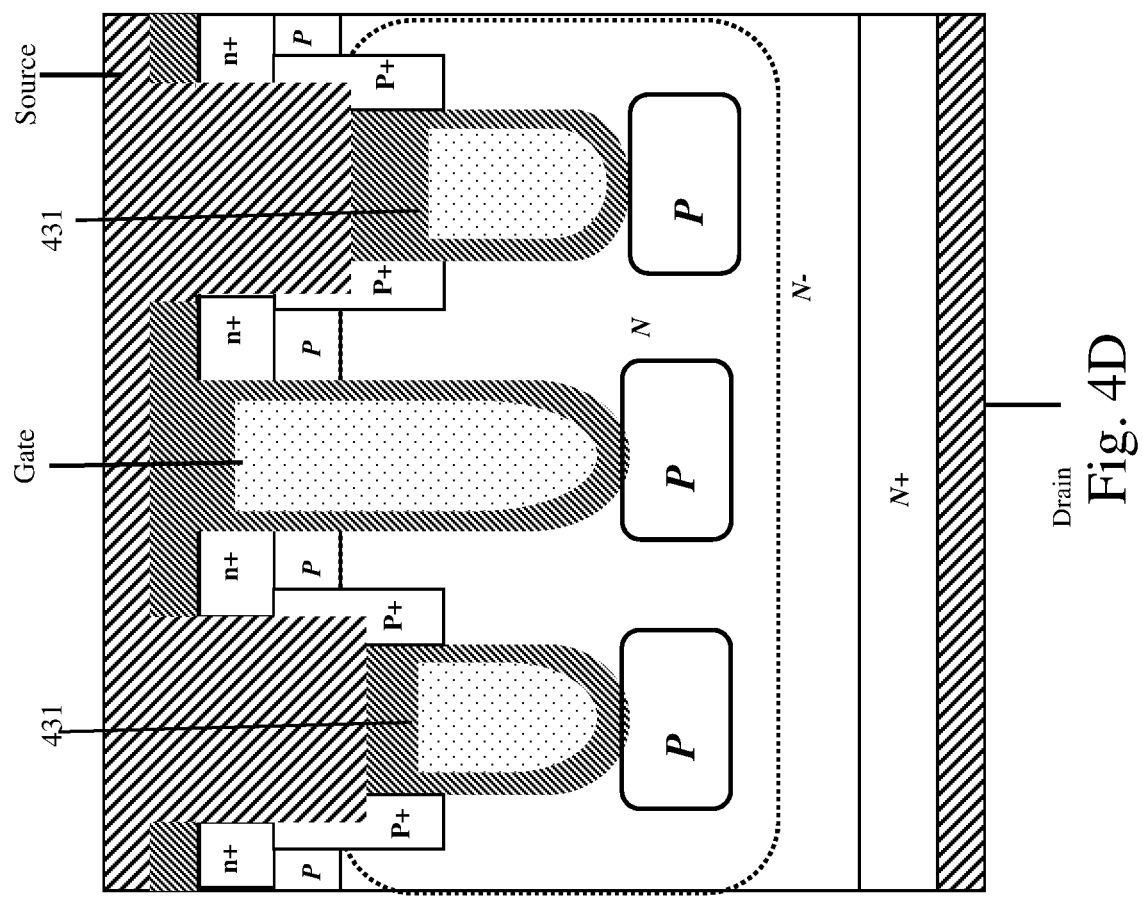

FIG. 4D shows another sample embodiment similar to that of FIG. 4C, except that the recessed field plates have been replaced with embedded recessed field plates (ESFP) 431.

FIG. 4E shows another sample embodiment similar to that of FIG. 4D, except that P+ body contact regions 417 have been extended to overlap P-shield regions 435A. In this embodiment, the vertical extents of the gate trench and ESFP trenches are also shorter than in e.g. FIG. 4D.

FIG. 4F shows another sample embodiment similar to that of FIG. 4C, which has split gate electrode 423B. This split gate electrode shields the gate 423A from the drain and lowers the gate-drain charge $Q_{gd}$. The split gate 423B is preferably connected to the source electrode at certain places in the device (not shown).

Figure 4G:
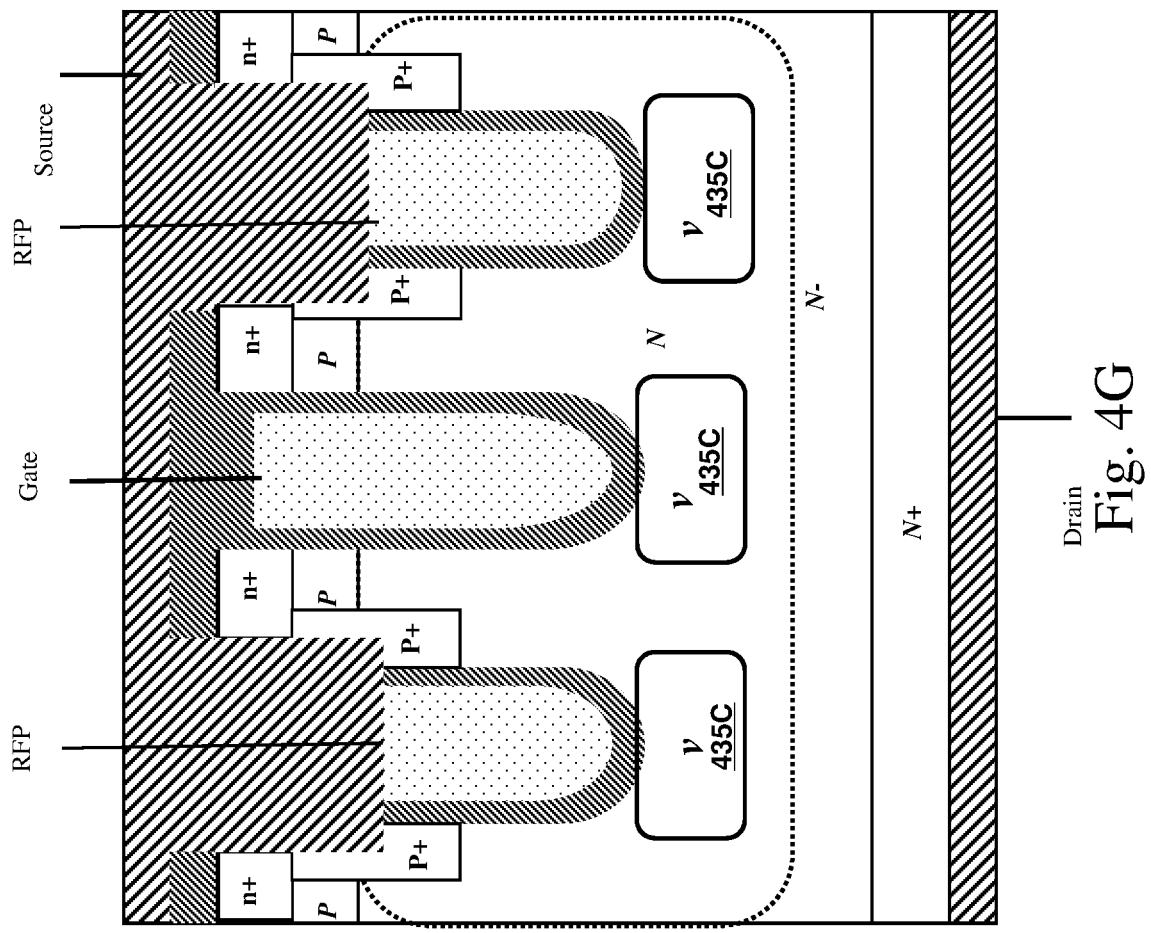
Figure 4H:
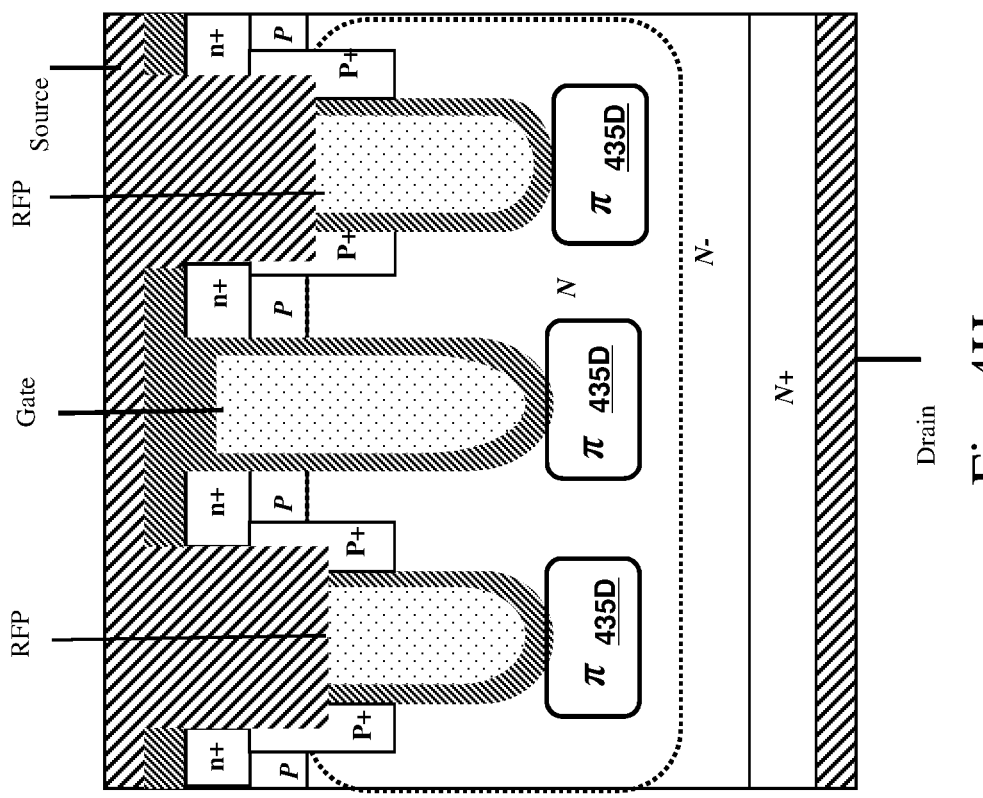

FIG. 4G shows another sample embodiment similar to that of FIG. 4C, in which shield regions 435C under the gate and RFP trenches are very lightly doped n (ν) regions. FIG. 4H shows another sample embodiment similar to that of FIG. 4G, in which shield regions 435D under the gate and RFP trenches are very lightly doped p (π) regions.

Figure 5:
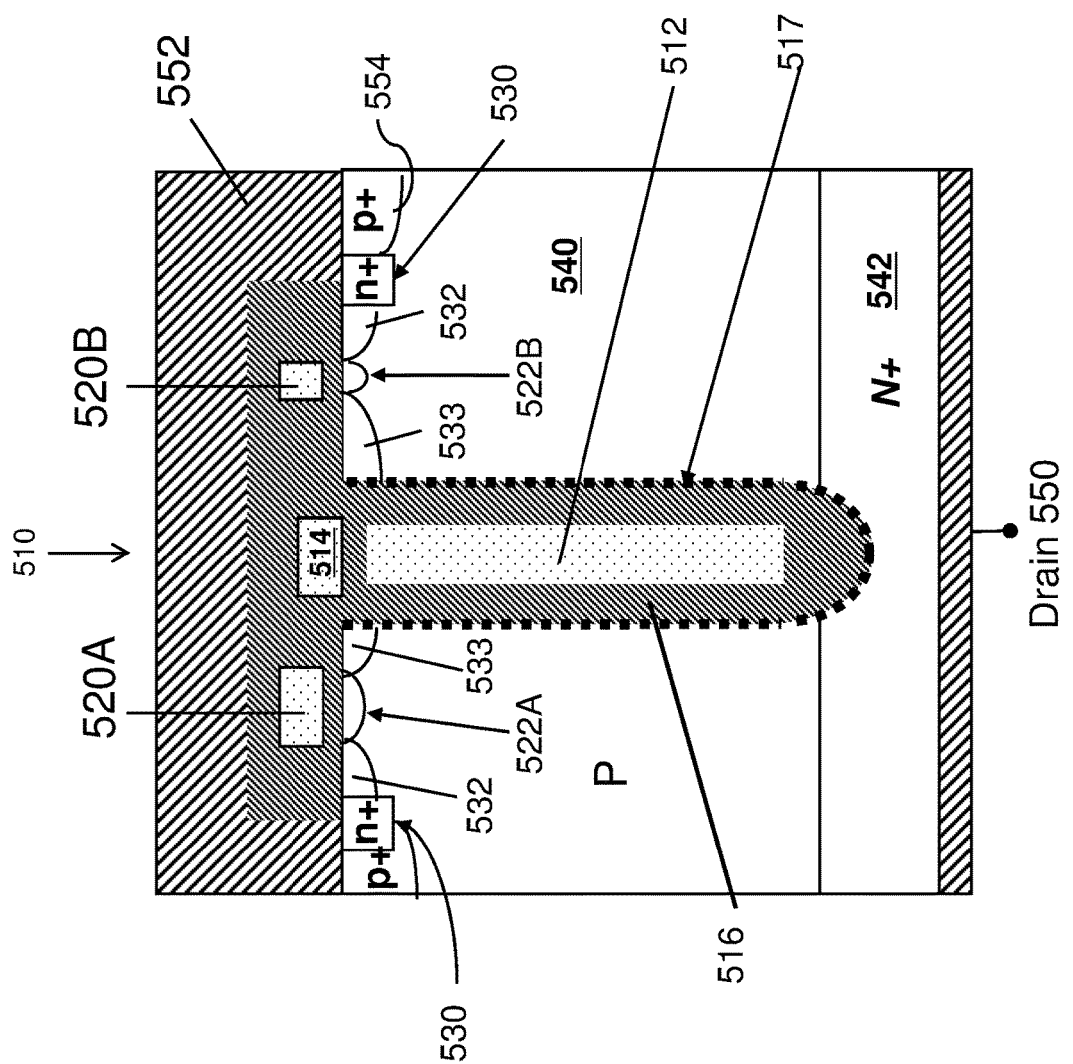
FIGS. 5, 6A, and 6B show several sample embodiments of quasi-vertical implementations of the present inventions.

FIG. 5 shows a quasi-vertical implementation, which also uses some of the innovative ideas described above in relation to the preceding figures. In this figure, a trench 510 includes a field plate 512 made of doped polysilicon, and a shield layer 514 which is above and insulated from the field plate. Gate electrodes 520A and 520B control conduction through channels 522A and 522B respectively, to allow electrons to be injected from source regions 530. The N+ source regions 530, in this example, are separated from channels 522A and 522B by LDD regions 532. These LDD regions could more precisely be referred to as "source extension regions". The channels 522A and 522B are merely portions of p-type body 540, which originally will have been provided as an epitaxial layer over an N+ substrate 542. The substrate 542 is contacted by a backside metallization 550. Similarly, the N+ source 530 and the P+ body contact region 554 are contacted by a frontside source metallization 552.

When one of gate electrodes 520A and 520B is driven positive, it will invert the respective channel location (522A or 522B) to allow injection of electrons. These will pass through the channel in that case and across to the LDD region 533 on the drain side.

Trench 510 also includes a dielectric layer 516 surrounding the field plate 512. At the interface between the dielectric layer 516 and the epitaxial layer 540, which is silicon in this example, permanent charge is provided. In this example, this is positive permanent charge 517, e.g. provided by cesium ions (Cs+) which were implanted into the trench near the oxide/silicon interface. The density of the positive permanent charge 517 is preferably high enough to invert an adjacent portion of the epitaxial layer 540. The area concentration of the permanent charge which is required to achieve this will of course depend on the acceptor dopant concentration of the epitaxial layer 540. In one example, for operation at 30 V, the thickness of the epitaxial layer 540 can be 3 microns, the doping of the epitaxial layer can be 2e16/cm$^3$, and the surface charge density of the permanent charge 517 can be 1.2e12/cm$^2$.

Thus in FIG. 5 the lateral transistors which are gated by gate electrodes 520A and 520B control lateral conduction, while the induced drain extension layers, adjacent to the trench 510, provide drain extensions, which also helps provide some charge balancing in the off state.

FIG. 5 shows transistors with different channel lengths and threshold voltages on the left and right sides of the trench 510. The left side channel 522A is longer than the right side channel 522B.

Figure 6A:
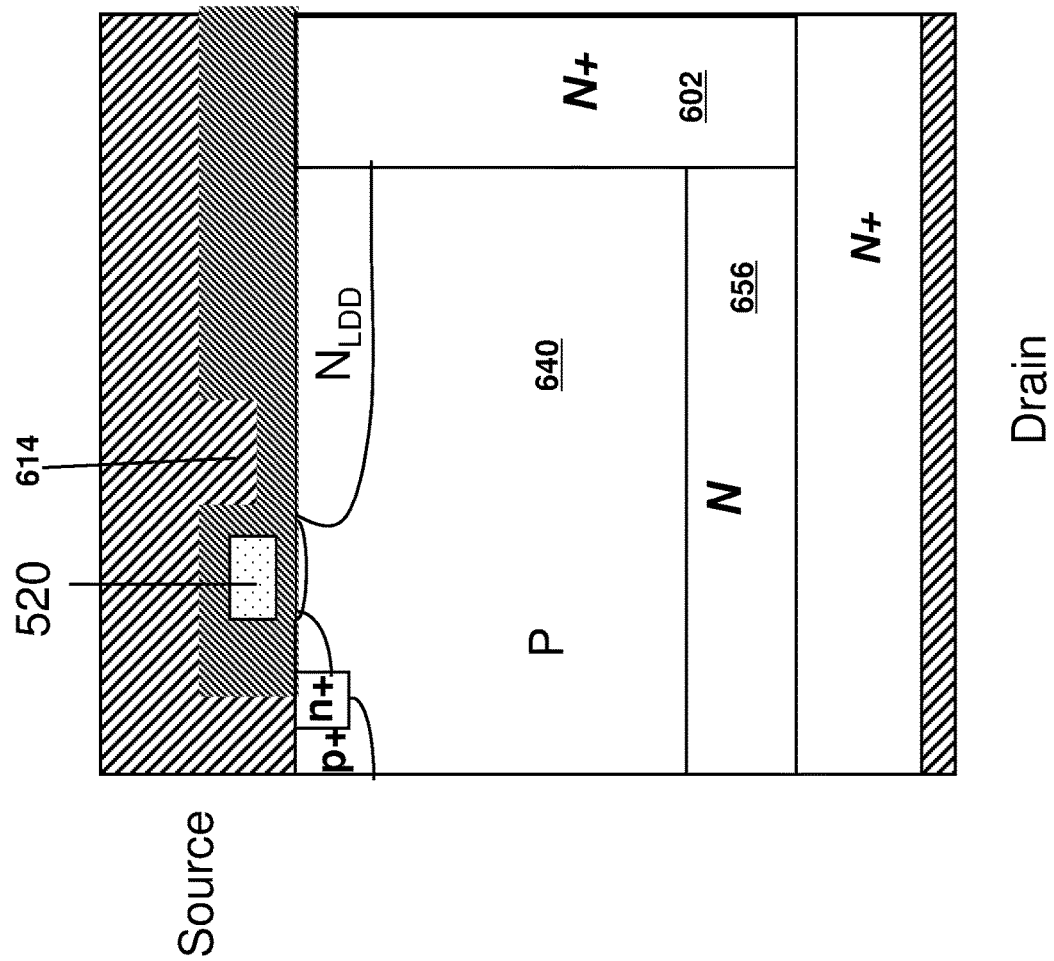

FIG. 6A shows a different lateral transistor or quasi-vertical device which can be used to implement either the circuit configuration shown in FIG. 2A or else the configuration shown in FIG. 2B. Note, however, that in FIG. 6A, conduction between the drain and the LDD region is provided by a vertically-extended N+ region 602. Note that, in this example, the shape of the source metallization has been modified to provide a shield shape 614 which laterally separates the gate electrode 520 from the vertically-extended diffusion 602. Note also that, in this example, P body region 640 is implanted into N-type epitaxial layer 656, rather than itself being an epitaxial layer as in FIG. 5.

Figure 6B:
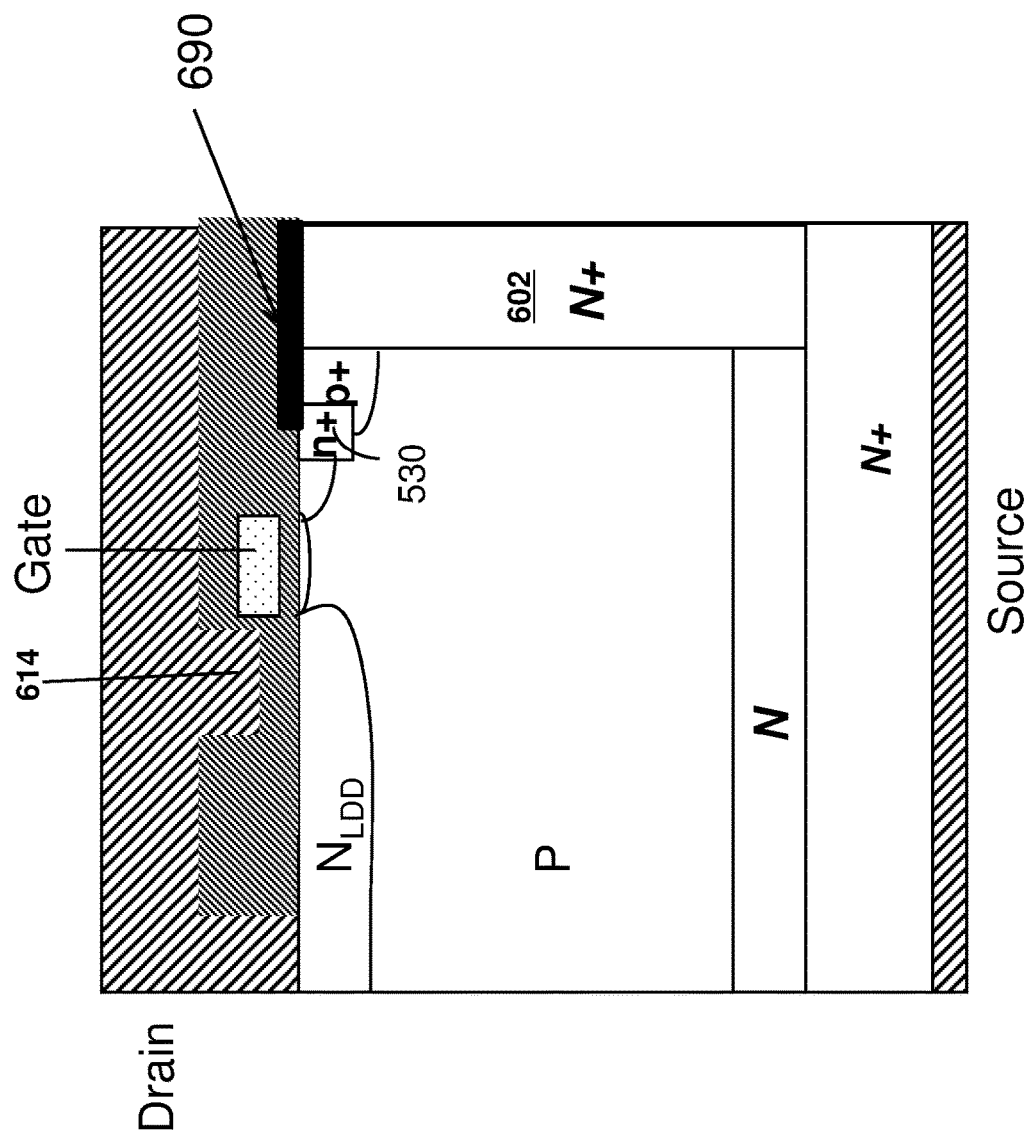
Figure 7A:
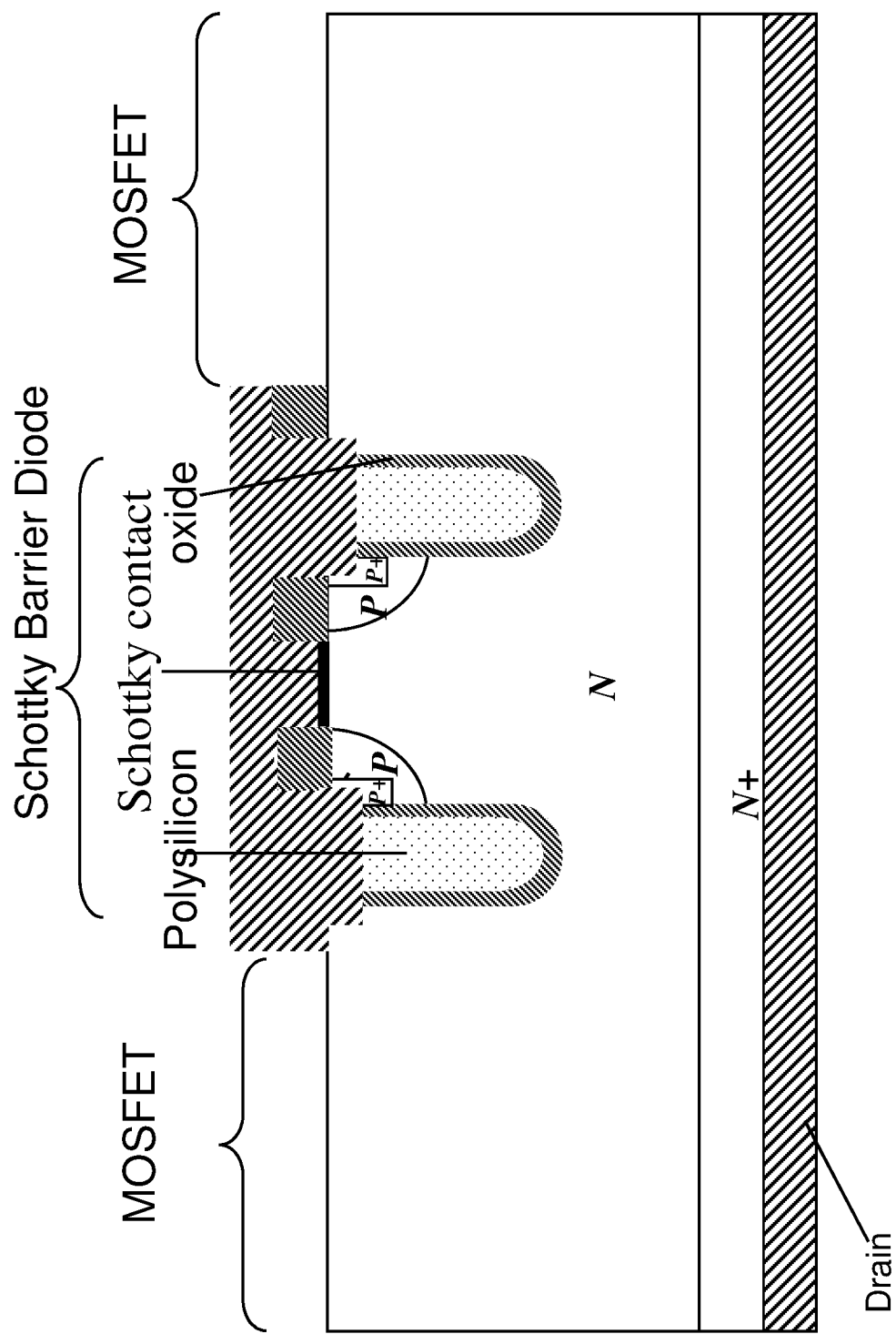
FIGS. 7A-7B show two structures using conventional Schottky Barrier Diodes.
Figure 7B:
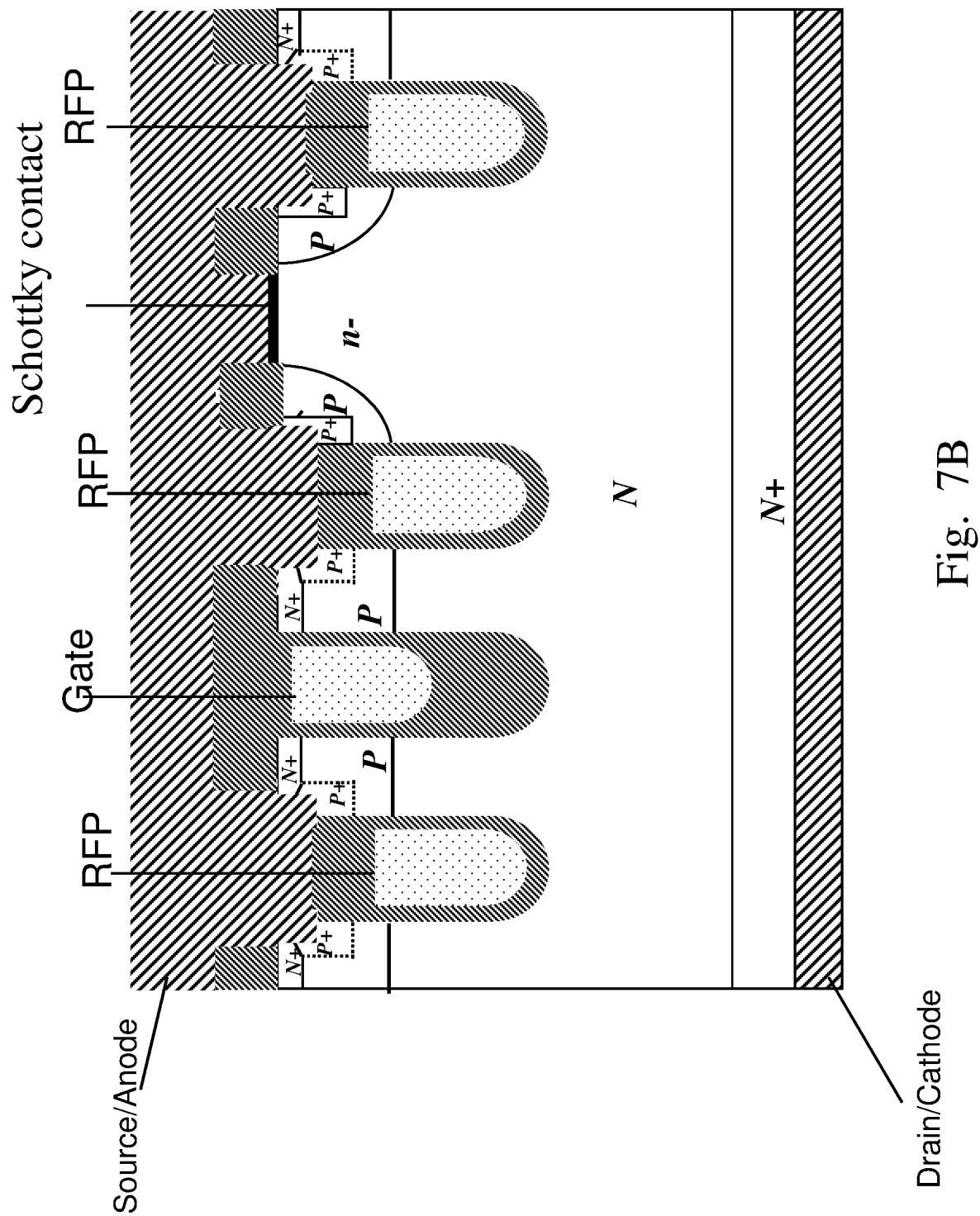

FIG. 6B is generally similar to FIG. 6A except that the transistor's gate and drain terminals are on the top and the source terminal is on the bottom of the transistor. Note also that, in this example, a shorting strap 690, e.g. of silicide, laterally connects the vertically-extended n+ diffusion 602 to the n+ source 530. Note also that this example, like the example of FIG. 6A, has a shielding shape 614 laterally interposed between the gate and the drain.

Figure 8:
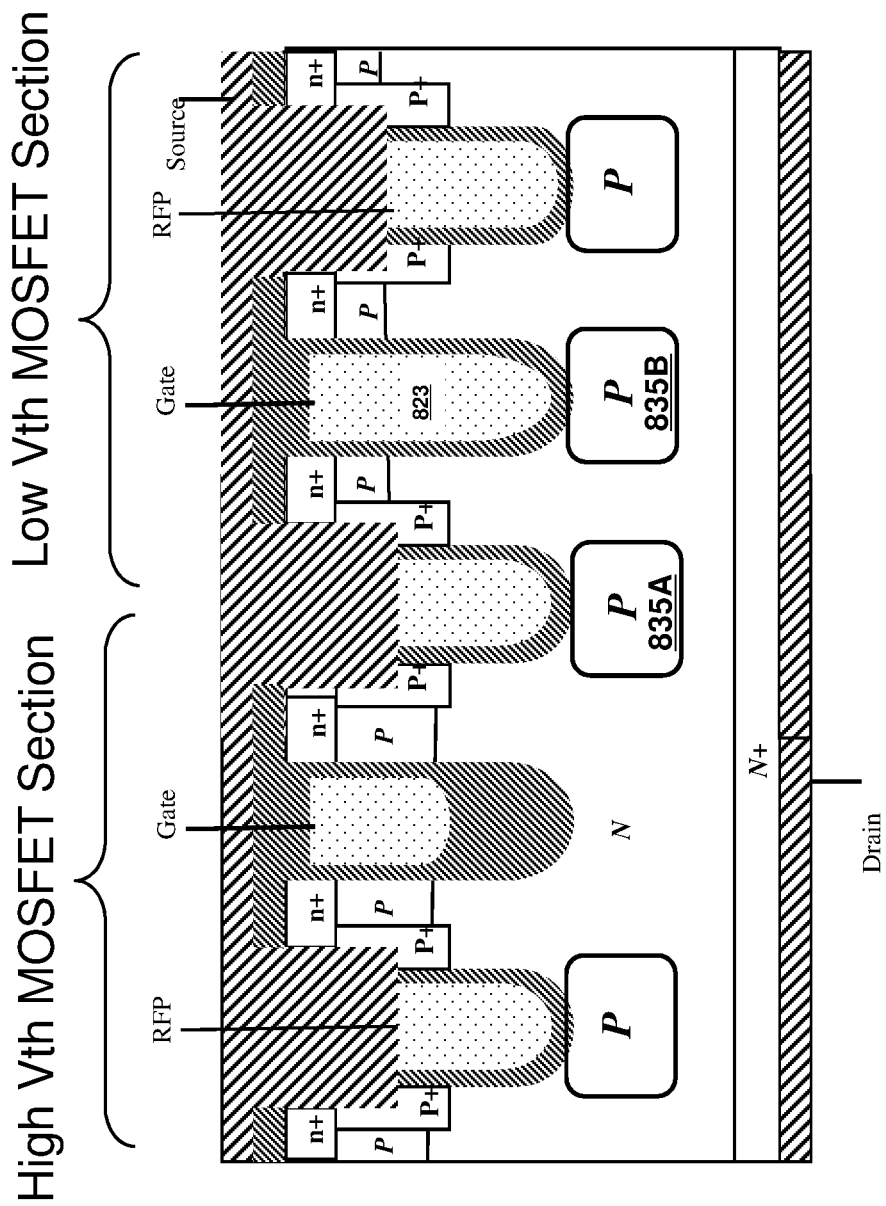
FIGS. 8, 9, 10A, and 10B show more sample embodiments of the present inventions.

FIG. 8 shows another sample embodiment similar to that of FIG. 1. P-shield regions 835A and 835B are present under recessed field plates 131 and low-threshold-voltage gate 823 respectively. Low-threshold-voltage gate electrode 823 fills the gate trench more completely, as in e.g. FIG. 4B. The P-shield regions are preferably connected to the P-body region in some places of the device (not shown).

Figure 9:
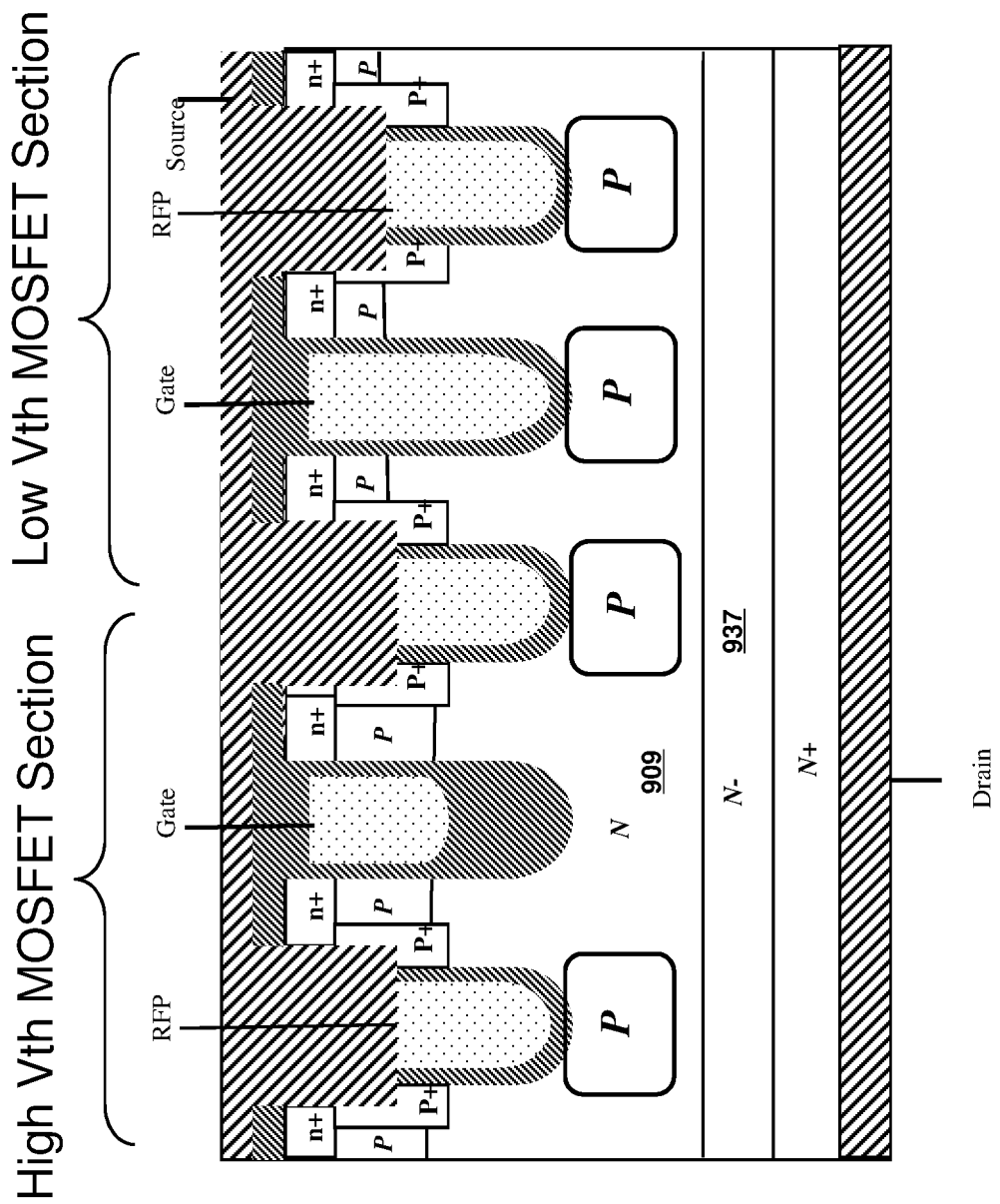

FIG. 9 shows another sample embodiment similar to that of FIG. 8, except that N region 909 is an n-enhancement layer located above N− epi layer 937, as in e.g. FIG. 4C.

Figure 10A:
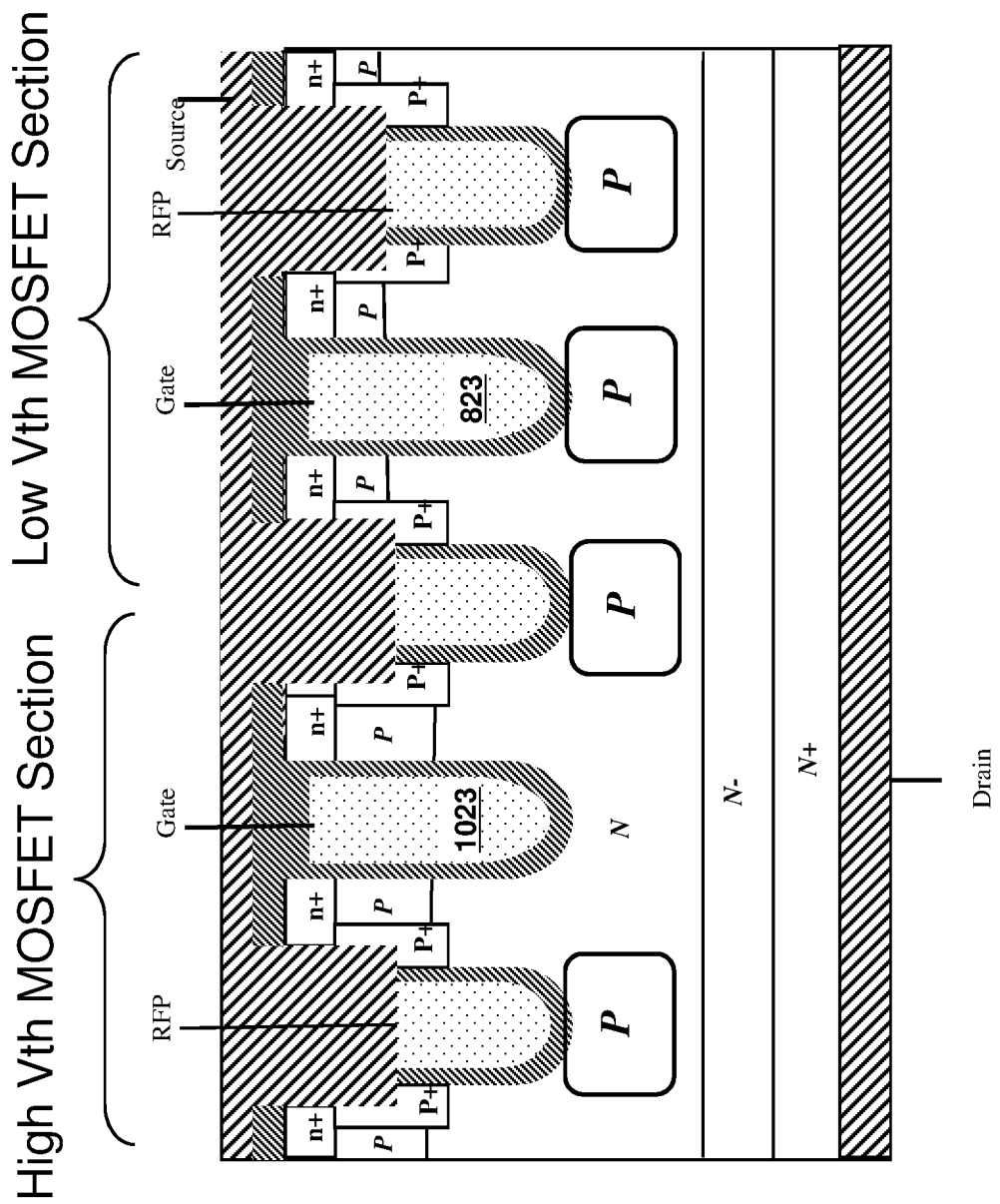
Figure 10B:
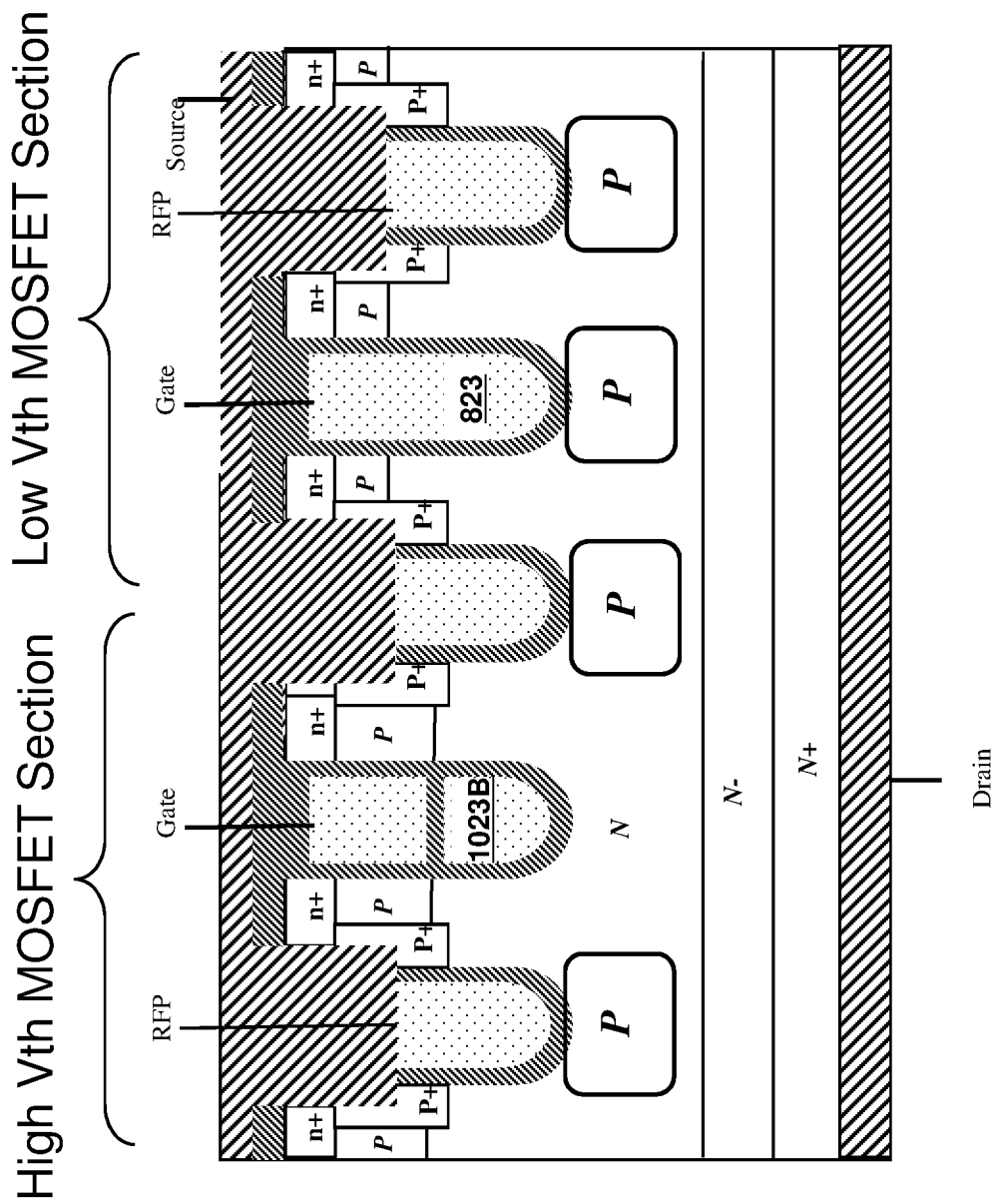

FIG. 10A shows another sample embodiment similar to that of FIG. 9, except that high-threshold-voltage gate electrode 1023 now extends to more completely fill the gate trench, in the same manner as does low-threshold-voltage gate electrode 823. FIG. 10B shows another sample embodiment similar to that of FIG. 10A except that the high-threshold-voltage gate trench includes split gate (shield) electrode 1023B.

Figure 11:
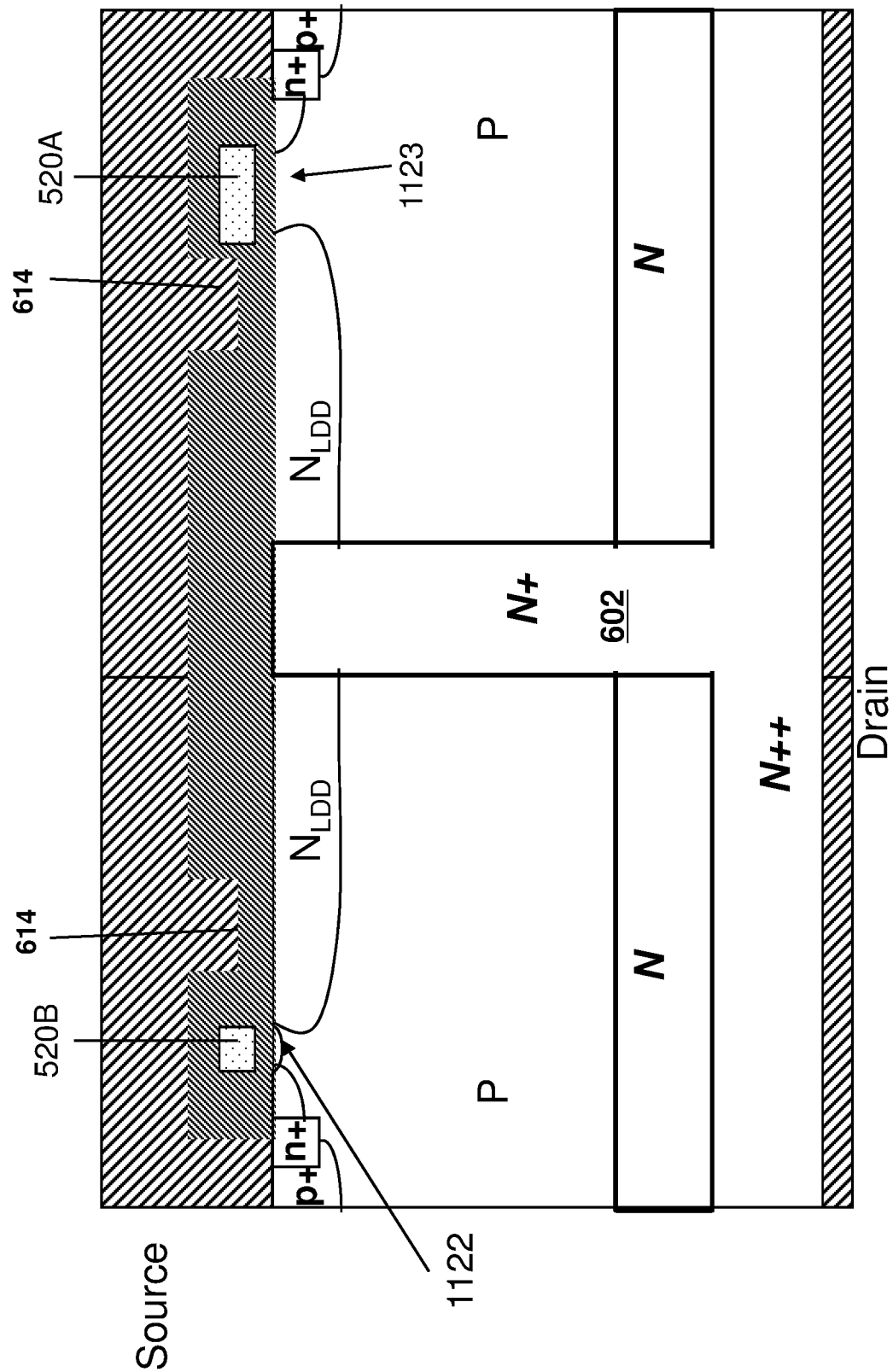
FIG. 11 shows another sample embodiment of a quasi-vertical implementation of the present inventions.

FIG. 11 shows another example of a quasi-vertical device in which different channel lengths or $V_{th}$ are present at left and right sides of the figure. In this example, note that the length of the channel 1122 of the lateral device on the left side is shorter than the effective length of the channel 1123 on the right side. Alternatively, the $V_{th}$ is lowered by using threshold adjustment implants. The gate electrodes 520A and 520B can be connected together, as in FIG. 2A, or can be separate, as in FIG. 2B. In this example, note that, again, shielding shapes 614 are laterally interposed between the gates and the drain-connected vertically-extended n+ region 602.

Figure 12A:
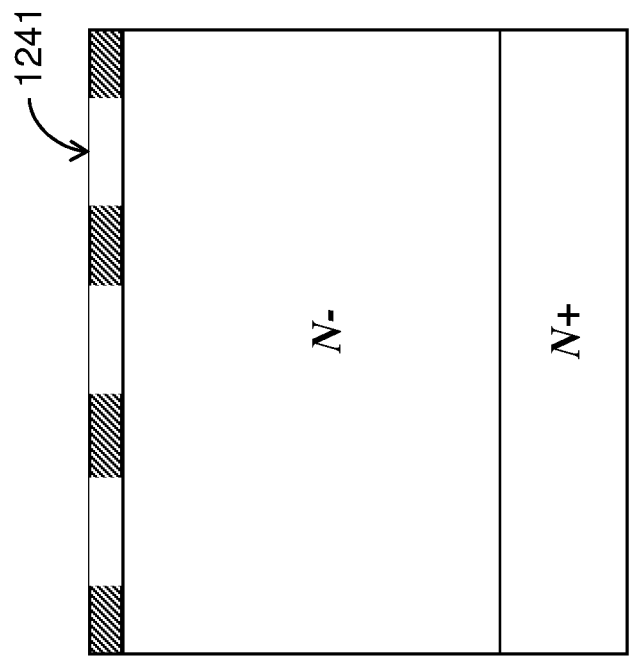
FIGS. 12A-12K show a sample process flow that can be used to realize the present inventions.
Figure 12B:
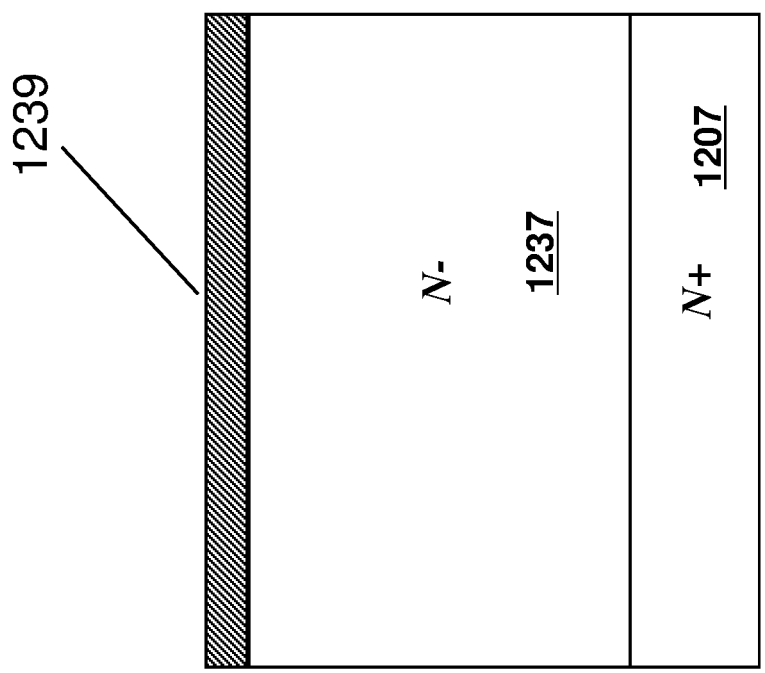
Figure 12D:
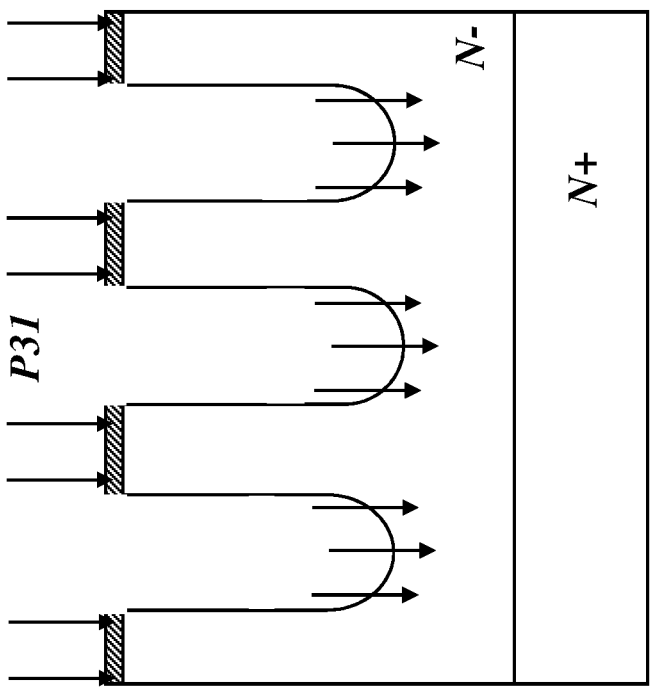
Figure 12C:
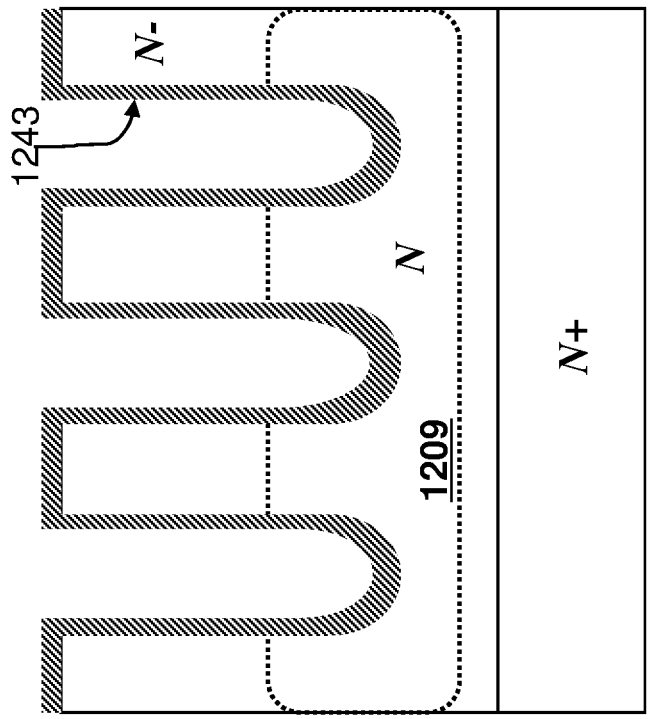
Figure 12F:
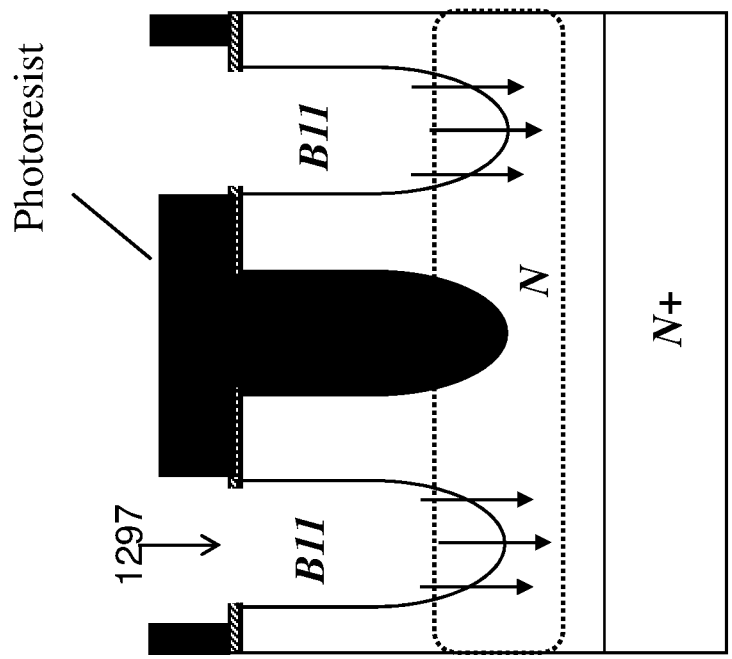
Figure 12E:
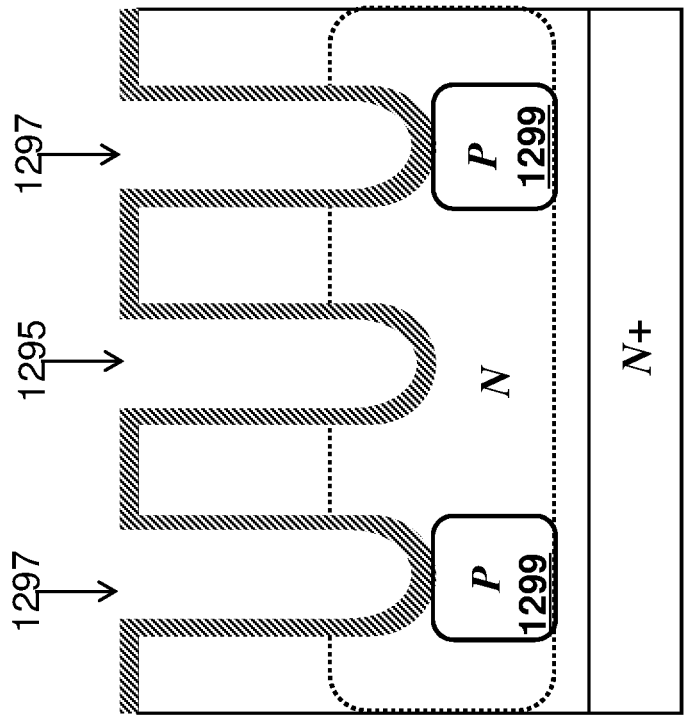
Figure 12H:
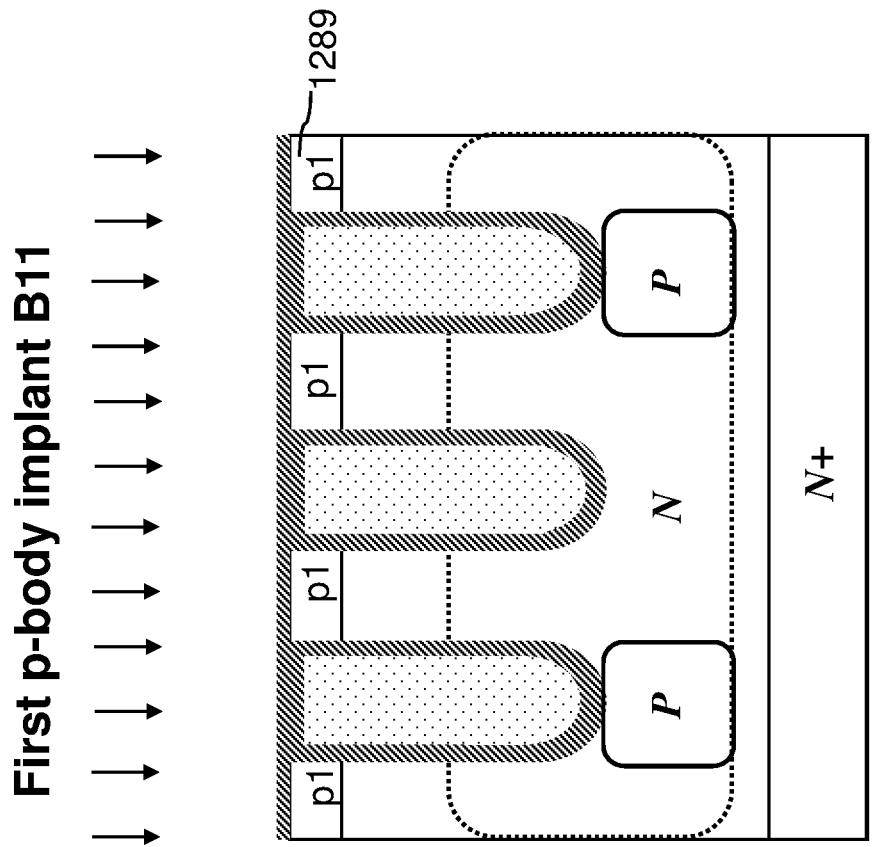
Figure 12G:
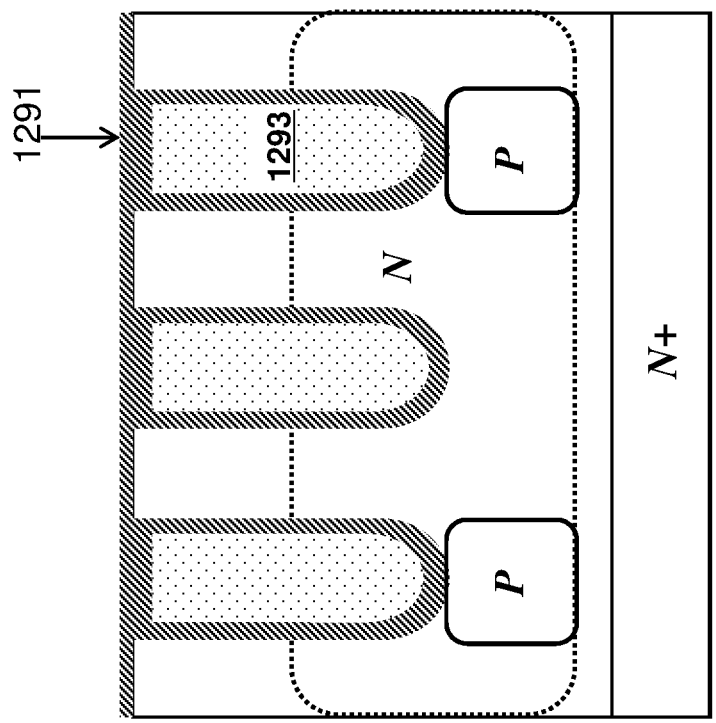
Figure 12I:
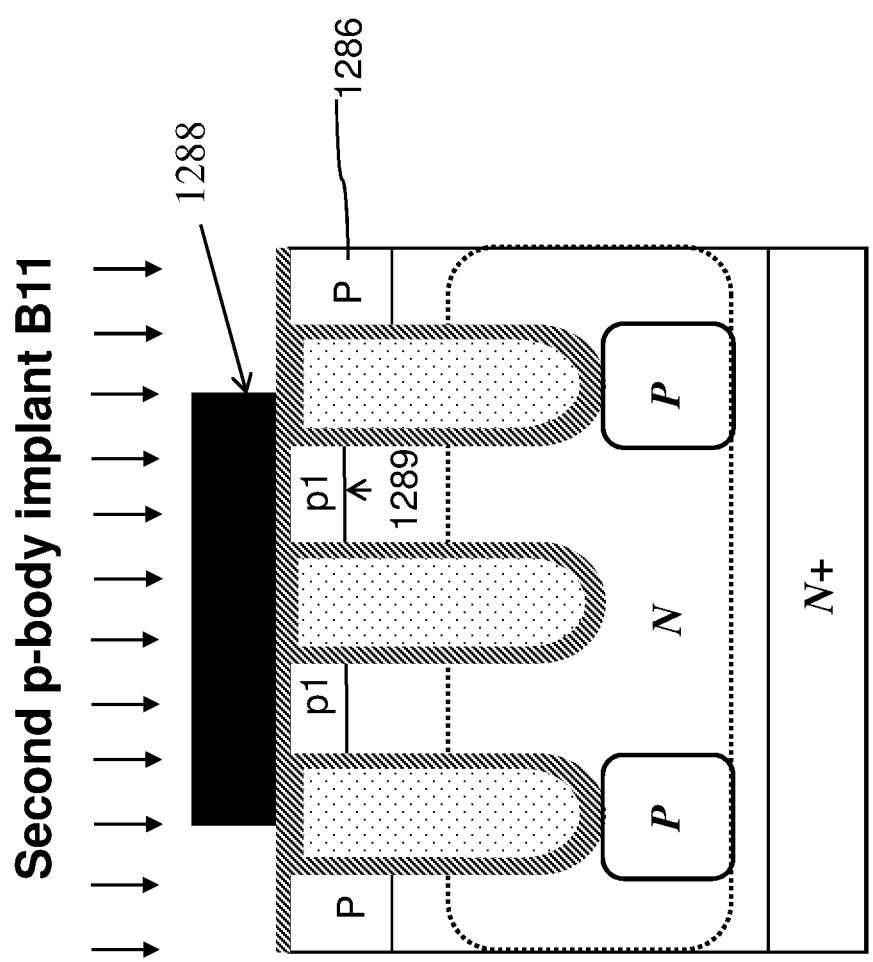
Figure 12J:
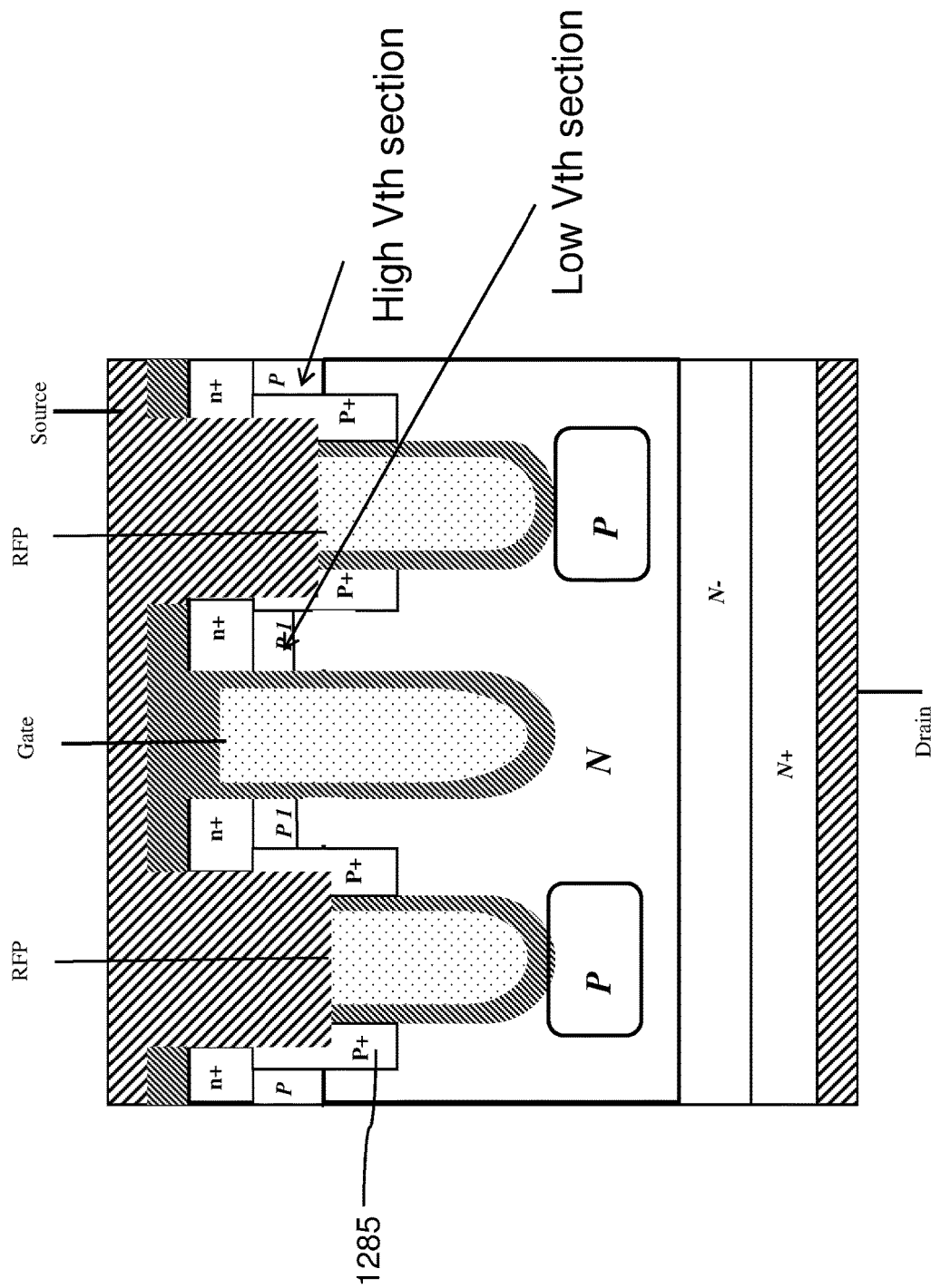
Figure 12K:
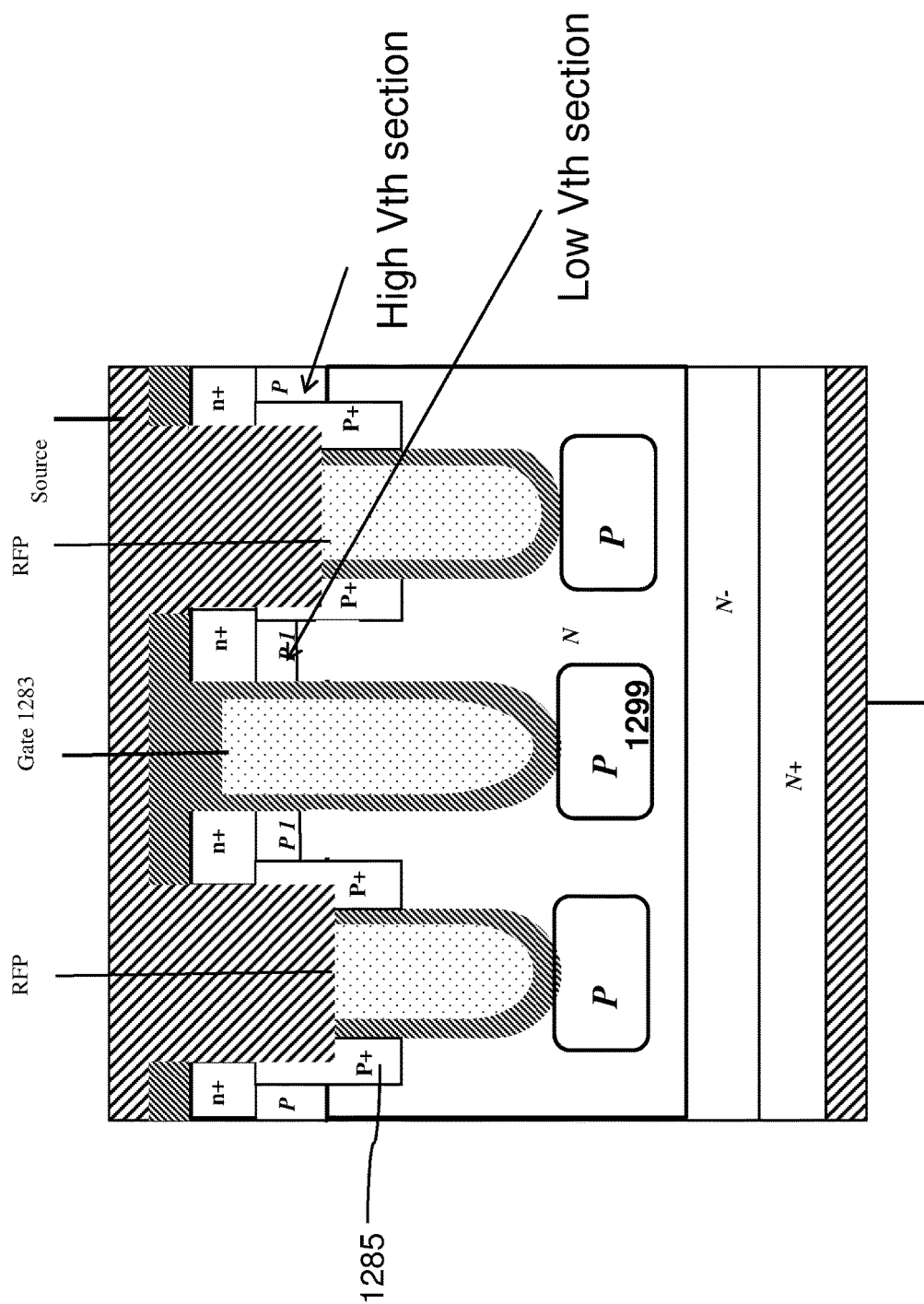

FIGS. 12A-12I show one sample fabrication sequence for manufacturing devices like those shown in FIGS. 12J-12K. FIG. 12A shows an N on N+ starting structure, including a lightly doped n− epitaxial layer 1237 overlying an N+ substrate 1207. In this example, both are silicon. In this example, a thick silicon dioxide layer 1239 has been grown atop the epitaxial layer. FIG. 12B shows a further stage in processing, where the oxide 1239 has been patterned to open holes 1241 in desired trench locations.

FIG. 12C shows a further stage of processing, in which a deep trench etch has been performed, and phosphorus ions (P31) are now being implanted. These additional acceptor atoms will provide additional doping 1209 above and below the depth of the trench bottoms, as shown in FIG. 12D. In FIG. 12D, a dielectric layer 1243 (which can be e.g. silicon dioxide) has been grown on exposed trench sidewalls and bottoms, and may be present also on the tops of the exposed mesa locations.

FIG. 12E shows an optional further stage in processing, in which a masked acceptor implant is made through the bottoms of the field plate trenches only, to form, as shown in FIG. 12F, deep P regions 1299 below the field plate trenches 1297 only, but not below the gate trenches 1295. FIG. 12G shows a further stage of processing, in which all trenches have been filled with a conductive material 1293, which can, for example, be n+ doped polysilicon. A top dielectric has been formed above the polysilicon in these trenches, for example by steam oxidation, and a top dielectric cap 1291 has been formed atop the trenches.

FIG. 12H shows a further stage in processing, in which acceptor implants (B11 in this example) are implanted, e.g. at an energy of 2e12 keV. This forms a shallow body region 1289 everywhere, since this is an unpatterned implant, except where trenches have removed the semiconductor material.

FIG. 12I shows a further stage in processing, where a second acceptor implant is being performed. In this example, a patterned photoresist layer 1288 is in place, and accordingly this implant only hits the outer body regions, and not the body regions which are covered by the photoresist 1288. This forms a deep body region 1286. Note that this deeper body region, unlike the shallower body region 1289, includes acceptor doping components due to both implantation steps.

These processing steps have formed a structure with different body thicknesses. Note that the transistor shown in the center of FIG. 12I is a shallow-body low-threshold-voltage transistor.

Processing then continues with many additional steps which are disclosed in other applications and patents of the inventors. For example, a recessed field plate contact etch is performed to form a wide metal contact to the recessed field plate, and a heavy acceptor implant forms P+ body contact regions 1285. Note that FIG. 12J shows both high-threshold-voltage structures, at the rightmost and leftmost sides, and low-threshold-voltage structures in the center.

If the optional implant shown in FIG. 12E is performed as an unmasked implant, rather than as a masked implant, a structure like that shown in FIG. 12K can be formed, where a deep p-type region 1299 is also present under the gate trench of gate electrode 1283.

According to some but not necessarily all embodiments, there is provided: Methods and systems for power semiconductor devices integrating multiple quasi-vertical transistors on a single chip. Multiple power transistors (or active regions) are paralleled, but one transistor has a lower threshold voltage. This reduces the voltage drop when the transistor is forward-biased. In an alternative embodiment, the power device with lower threshold voltage is simply connected as a depletion diode, to thereby shunt the body diodes of the active transistors, without affecting turn-on and ON-state behavior.

According to some but not necessarily all embodiments, there is provided: A power semiconductor device, comprising: a first and a second quasi-vertical transistor integrated on a semiconductor die, each said quasi-vertical transistor having a lateral gated portion and a vertical conduction portion; wherein said vertical conduction portions thereof are identical; and wherein the lateral gated portion of said first quasi-vertical transistor is narrower than the lateral gated portion of said second quasi-vertical transistor.

According to some but not necessarily all embodiments, there is provided: A power semiconductor device, comprising: a first and a second laterally-gated transistor both having a portion of a first-conductivity-type source region, a gate electrode which is capacitively coupled to a body region to selectably form a lateral channel therein, and a first-conductivity-type drain extension region laterally connecting said lateral channel to a vertically-extended conduction region extending from a single common drain region; wherein both said gate electrodes are electrically separate portions of a single thin film layer; wherein the threshold voltage of said first laterally-gated transistor is less than the threshold voltage of said second laterally-gated transistor; wherein both said laterally-gated transistors are connected identically to a common source electrode and a common drain electrode, except that the gate electrode of said first laterally-gated transistor, but not the gate electrode of said second laterally-gated transistor, is connected to said common source electrode.

According to some but not necessarily all embodiments, there is provided: A power semiconductor device, comprising: a first and a second laterally-gated transistor both having a portion of a first-conductivity-type source region, a gate electrode which is capacitively coupled to a body region to selectably form a lateral channel therein, and a first-conductivity-type drain extension region laterally connecting said lateral channel to a vertically-extended conduction region extending from a single common drain region; wherein the threshold voltage of said first laterally-gated transistor is less than the threshold voltage of said second laterally-gated transistor; wherein both said gate electrodes are electrically separate portions of a single thin film layer; and wherein both said laterally-gated transistors are connected identically to a common source electrode, a common gate electrode, and a common drain electrode.

According to some but not necessarily all embodiments, there is provided: A power semiconductor device, comprising: a first and second group of laterally-gated transistors integrated on a single semiconductor die, each said laterally-gated transistor having a first-conductivity-type source region, a gate electrode which is capacitively coupled to a body region to selectably form a lateral channel therein, and a vertically-extended conduction region connecting a drain region to a drain extension region which is adjacent to said lateral channel; wherein the threshold voltages of said first group of laterally-gated transistors are lower than the threshold voltages of said second group of laterally-gated transistors, and said first group of laterally-gated transistors have a higher drive capability than said second group of laterally-gated transistors; and wherein each said gate electrode in said first group of laterally-gated transistors, but not in said second group of laterally-gated transistors, is shorted to a common source electrode.

According to some but not necessarily all embodiments, there is provided: A power semiconductor device, comprising: a first and a second laterally-gated transistor both having a first-conductivity-type source region, and a gate electrode which is capacitively coupled to a body region to selectably form a lateral channel therein, and a first-conductivity-type drain extension region laterally connecting said lateral channel to a vertically-extended conduction region extending from a single common drain region; wherein the threshold voltage of said first laterally-gated transistor is lower than the threshold voltage of said second laterally-gated transistor; wherein both said laterally-gated transistors are connected identically to a common source electrode, a common gate electrode, and a common drain electrode; and wherein the width of the gate electrode of said first laterally-gated transistor is less than the width of the gate electrode of said second laterally-gated transistor.

According to some but not necessarily all embodiments, there is provided: A power semiconductor device, comprising: a first and second group of laterally-gated transistors integrated on a single semiconductor die, each said laterally-gated transistor having a first-conductivity-type source region, and a gate electrode which is capacitively coupled to a body region to selectably form a lateral channel therein, and a vertically-extended conduction region connecting a drain region to a drain extension region which is adjacent to said lateral channel; wherein the threshold voltages of said first group of laterally-gated transistors are lower than the threshold voltages of said second group of laterally-gated transistors; wherein the vertically-extended conduction region of at least each said second laterally-gated transistor is provided by fixed electrostatic charges in the walls of a trenched field plate, which invert a portion of said body region.

According to some but not necessarily all embodiments, there is provided: A power semiconductor device, comprising: a first and a second laterally-gated transistor both having a portion of a first-conductivity-type source region, a gate electrode which is capacitively coupled to a body region to selectably form a lateral channel therein, a first-conductivity-type drain extension region connecting said lateral channel to a common drain electrode, and a vertically-extended source extension region connecting said source region to a common source electrode on the backside of the device; wherein both said gate electrodes are electrically separate portions of a single thin film layer; wherein the threshold voltage of said first laterally-gated transistor is less than the threshold voltage of said second laterally-gated transistor; wherein the gate electrode of said first laterally-gated transistor, but not the gate electrode of said second laterally-gated transistor, is connected to said common source electrode.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

In some alternative embodiments, the lower-threshold-voltage transistor can be connected as a depletion diode, or can be connected completely in parallel with the main array of devices.

In some alternative embodiments, other methods used to adjust threshold voltage include decreasing the depth of the p-body junction, increasing the depth of the source junction, and adjusting both depths simultaneously.

In one alternative embodiment, threshold voltage is lowered by implanting positive ions at oxide-silicon interfaces of the MOSFET channel to create permanent positive charge.

In one alternative embodiment, threshold voltage is adjusted by implanting e.g. As impurities in the appropriate regions.

In one alternative embodiment, the lower-threshold-voltage transistor can have a smaller width than the higher-threshold-voltage transistor.

In one alternative embodiment, the lower-threshold-voltage transistor can have a higher drive capability than the higher-threshold-voltage transistor.

In some embodiments, the threshold-voltage adjustment methods recited above are used singly or in any operable combination, except where indicated.

In one alternative embodiment, the trench gate electrode can be a split gate electrode.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

Additional general background, which helps to show variations and implementations, as well as some features which can be synergistically with the inventions claimed below, may be found in the following US patent applications. All of these applications have at least some common ownership, copendency, and inventorship with the present application, and all of them are hereby incorporated by reference: U.S. Pat. No. 8,076,719, US 2010-0219462 A1, and US 2011-0254088 A1.

The claims as filed are intended to be as comprehensive as possible, and NO subject matter is intentionally relinquished, dedicated, or abandoned.

What is claimed is:

1. A power semiconductor device, comprising:
a first and second group of laterally-gated transistors integrated on a single semiconductor die, each said laterally-gated transistor having a first-conductivity-type source region, and a gate electrode which is capacitively coupled to a body region to selectably form a lateral channel therein, and a vertically-extended conduction region connecting a drain region to a drain extension region which is adjacent to said lateral channel;
wherein the threshold voltages of said first group of laterally-gated transistors are lower than the threshold voltages of said second group of laterally-gated transistors;
wherein the vertically-extended conduction region of at least each said second laterally-gated transistor is provided by fixed electrostatic charges in the walls of a trenched field plate, which invert a portion of said body region; and
shielding shapes interposed between the gate electrodes of said laterally-gated transistors.

2. The device of claim 1, wherein said first conductivity type is N type.

3. The device of claim 1, wherein said semiconductor die is made of silicon.

4. A power semiconductor device, comprising:
a first and a second laterally-gated transistor both having a portion of a first-conductivity-type source region, a gate electrode which is capacitively coupled to a body region to selectably form a lateral channel therein, a first-conductivity-type drain extension region connecting said lateral channel to a common drain electrode, and a vertically-extended source extension region connecting said source region to a common source electrode on the backside of the device;
wherein both said gate electrodes are electrically separate portions of a single thin film layer;
wherein the threshold voltage of said first laterally-gated transistor is less than the threshold voltage of said second laterally-gated transistor;
wherein the gate electrode of said first laterally-gated transistor, but not the gate electrode of said second laterally-gated transistor, is connected to said common source electrode; and
wherein said vertically-extended source extension regions are a single common region which laterally separates said first and second laterally-gated transistors.

5. A power semiconductor device, comprising:
a first and a second laterally-gated transistor both having a portion of a first-conductivity-type source region, a gate electrode which is capacitively coupled to a body region to selectably form a lateral channel therein, a first-conductivity-type drain extension region connecting said lateral channel to a common drain electrode, and a vertically-extended source extension region connecting said source region to a common source electrode on the backside of the device;
wherein both said gate electrodes are electrically separate portions of a single thin film layer;
wherein the threshold voltage of said first laterally-gated transistor is less than the threshold voltage of said second laterally-gated transistor;
wherein the gate electrode of said first laterally-gated transistor, but not the gate electrode of said second laterally-gated transistor, is connected to said common source electrode.

6. The device of claim 5, wherein the lateral channel of said first laterally-gated transistor has a shorter lateral extent than does the lateral channel of said second laterally-gated transistor.

7. The device of claim 5, further comprising impurities implanted in the lateral channel of said first laterally-gated transistor which decrease the threshold voltage of said first laterally-gated transistor.

8. The device of claim 5, wherein said laterally-gated transistors both have a first-conductivity-type lateral source extension region laterally connecting said source region to said lateral channel.

9. The device of claim 5, further comprising a shielding shape interposed between said gate electrodes.

10. The device of claim 5, wherein said first conductivity type is N type.

* * * * *